(12) United States Patent
Sang et al.

(10) Patent No.: US 12,451,075 B2
(45) Date of Patent: Oct. 21, 2025

(54) DRIVING CIRCUIT AND DISPLAY DEVICE USING THE SAME

(71) Applicant: LG Display Co., Ltd., Seoul (KR)

(72) Inventors: Wookyu Sang, Paju-si (KR); Moonsoo Chung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/934,637

(22) Filed: Nov. 1, 2024

(65) Prior Publication Data

US 2025/0061858 A1 Feb. 20, 2025

Related U.S. Application Data

(63) Continuation of application No. 18/486,090, filed on Oct. 12, 2023, now Pat. No. 12,165,590, which is a continuation of application No. 17/944,930, filed on Sep. 14, 2022, now Pat. No. 11,817,055, which is a continuation of application No. 17/379,876, filed on Jul. 19, 2021, now Pat. No. 11,468,839.

(30) Foreign Application Priority Data

Aug. 18, 2020 (KR) .................. 10-2020-0103392

(51) Int. Cl.
G09G 3/3233 (2016.01)
G09G 3/3266 (2016.01)
G09G 3/3283 (2016.01)

(52) U.S. Cl.
CPC ......... *G09G 3/3233* (2013.01); *G09G 3/3266* (2013.01); *G09G 3/3283* (2013.01); *G09G 2300/0426* (2013.01); *G09G 2300/0809* (2013.01); *G09G 2310/0243* (2013.01); *G09G 2310/08* (2013.01); *G09G 2320/0233* (2013.01)

(58) Field of Classification Search
None
See application file for complete search history.

(56) References Cited

U.S. PATENT DOCUMENTS

| | | | |
|---|---|---|---|
| 10,424,255 | B2 | 9/2019 | Pyo et al. |
| 10,810,930 | B2 | 10/2020 | Shim et al. |
| 10,916,198 | B2 | 2/2021 | Lin et al. |
| 10,930,222 | B2 | 2/2021 | Pyo et al. |
| 11,282,462 | B2 | 3/2022 | Lin et al. |
| 11,651,736 | B2 | 5/2023 | Lin et al. |

(Continued)

FOREIGN PATENT DOCUMENTS

| | | |
|---|---|---|
| CN | 108109583 A | 6/2018 |
| CN | 109087610 A | 12/2018 |

(Continued)

OTHER PUBLICATIONS

European Patent Office, Extended European Search Report, EP Patent Application No. 21191057.5, Jan. 14, 2022, 13 pages.

(Continued)

*Primary Examiner* — Christopher J Kohlman
(74) *Attorney, Agent, or Firm* — Fenwick & West LLP

(57) ABSTRACT

Disclosed is an electroluminescent display device using a variable refresh rate (VRR) mode. The purpose of the present disclosure is to reduce the occurrence of a difference in luminance at a time point of a refresh rate change, thereby preventing viewers from perceiving the variation of the refresh rate.

19 Claims, 23 Drawing Sheets

(56) References Cited

U.S. PATENT DOCUMENTS

| | | |
|---|---|---|
| 11,887,546 B2 | 1/2024 | Lin et al. |
| 2017/0124958 A1 | 5/2017 | Pyo et al. |
| 2018/0151109 A1* | 5/2018 | Shim .................... G09G 3/32 |
| 2019/0362678 A1 | 11/2019 | Shin et al. |
| 2020/0211475 A1 | 7/2020 | Park et al. |
| 2020/0226978 A1 | 7/2020 | Lin et al. |
| 2021/0020109 A1 | 1/2021 | Lin et al. |
| 2021/0118361 A1 | 4/2021 | Li |
| 2021/0183321 A1 | 6/2021 | Pyo et al. |
| 2021/0287605 A1 | 9/2021 | Wang et al. |
| 2022/0180812 A1 | 6/2022 | Lin et al. |
| 2022/0199010 A1 | 6/2022 | Zhao et al. |
| 2023/0237965 A1 | 7/2023 | Lin et al. |

FOREIGN PATENT DOCUMENTS

| | | |
|---|---|---|
| CN | 111383596 A | 7/2020 |
| CN | 111489646 A | 8/2020 |
| JP | 2016-170385 A | 9/2016 |
| JP | 2017-083813 A | 5/2017 |
| JP | 2020-112795 A | 7/2020 |
| KR | 10-2020-0087711 A | 7/2020 |

OTHER PUBLICATIONS

Japanese Office Action, Japan Patent Office Application No. 2021-133197, Jul. 12, 2022, 14 pages.

Korean Intellectual Property Office, Office Action, Korean Patent Application No. 10-2020-0103392, Feb. 20, 2024, 21 pages.

Taiwanese Office Action and Search Report (with English Concise Explanation of Relevance), Taiwan Intellectual Property Office Patent Application No. 110126086, Jun. 30, 2022, 13 pages.

The Japan Patent Office, Office Action, Japanese Patent Application No. 2021-133197, May 9, 2023, six pages.

The Japan Patent Office, Office Action, Japanese Patent Application No. 2023-194579, Jul. 16, 2024, 14 pages.

United States Office Action, U.S. Appl. No. 17/379,876, filed Mar. 16, 2022, ten pages.

United States Office Action, U.S. Appl. No. 17/944,930, filed Mar. 30, 2023, eight pages.

United States Office Action, U.S. Appl. No. 18/486,090, filed May 9, 2024, seven pages.

* cited by examiner (a) refresh rate: 60Hz (b) refresh rate: 1Hz

DRIVING CIRCUIT AND DISPLAY DEVICE USING THE SAME

CROSS-REFERENCE TO RELATED APPLICATION

This application is a continuation of U.S. patent application Ser. No. 18/486,090 filed on Oct. 12, 2023, which is a continuation application of U.S. patent application Ser. No. 17/944,930 filed on Sep. 14, 2022, which is a continuation application of U.S. patent application Ser. No. 17/379,876 filed on Jul. 19, 2021 (now U.S. Pat. No. 11,468,839 issued on Oct. 11, 2022), which claims the benefit of Korean Patent Application No. 10-2020-0103392 filed on Aug. 18, 2020, the entire contents of all of which are incorporated herein by reference for all purposes as if fully set forth herein.

BACKGROUND

Field

The present disclosure relates to an electroluminescent display device using a variable refresh rate (VRR) mode, which is designed to reduce the occurrence of a difference in luminance at the time of a refresh rate change.

Description of the Related Art

An electroluminescent display device which uses an electroluminescent device such as an organic light emitting diode may be driven by various driving frequencies.

Recently, as one of various functions required for the display device, a variable refresh rate (VRR) is also required. The VRR is a technology that drives a display device at a constant frequency and activates pixels by increasing the refresh rate when high-speed driving is required, and drives pixels by reducing the refresh rate when it is necessary to reduce power consumption or low-speed driving is required.

When the refresh rate at which the data voltage is updated according to the VRR changes, the change of the refresh rate may be perceived unnaturally by viewers. Accordingly, it is required to prevent the viewers from perceiving the change of the refresh rate.

SUMMARY

The present disclosure relates to an electroluminescent display device using a variable refresh rate (VRR) mode, and the purpose of the present disclosure is to reduce the occurrence of a difference in luminance at the time of a refresh rate change, thereby preventing viewers from perceiving the change of the refresh rate.

The present disclosure provides a means for solving the above-mentioned problems and has the following embodiments.

One embodiment is a display device including: a pixel which includes an electroluminescent device including a pixel electrode and a cathode electrode and includes a pixel circuit configured to drive the electroluminescent device; and a driver which is configured to generates signals for driving the pixel circuit. The pixel is driven through a refresh frame period and a hold frame period. The pixel circuit includes: a driving transistor which has a source electrode, a drain electrode, and a gate electrode and supplies a driving current to the electroluminescent device; a compensation transistor which is configured to connect the drain electrode and the gate electrode of the driving transistor in accordance with a first scan signal supplied from the driver; a first bias transistor which is configured to apply a first bias voltage to the drain electrode of the driving transistor in accordance with a second scan signal supplied from the driver; and a second bias transistor which is configured to apply a second bias voltage to the pixel electrode of the electroluminescent device in accordance with the second scan signal supplied from the driver. The first bias voltage has a first voltage and a second voltage higher than the first voltage. When the compensation transistor performs an off-operation, the second voltage is applied to the drain electrode of the driving transistor and the first and the second bias transistors perform an on-operation. Before and after switching from a first refresh rate to a second refresh rate lower than the first refresh rate, the second voltage of the first bias voltage or the second bias voltage is dynamically controlled.

Another embodiment is a display device including: an electroluminescent device; a driving transistor which is configured to supply a driving current to the electroluminescent device; and a driving driver which dynamically controls a first bias voltage and a second bias voltage before and after switching from a first refresh rate to a second refresh rate. The first bias voltage is applied to the driving transistor, and the second bias voltage is applied to the electroluminescent device.

Further, another embodiment is a display driving driver for driving a pixel circuit connected to an electroluminescent device including a pixel electrode and a cathode electrode. The display driving driver is configured to generate signals for driving the pixel circuit in such a way as to be able to switch between a first refresh rate and a second refresh rate lower than the first refresh rate. The pixel is driven through a refresh frame period and a hold frame period. The pixel circuit includes: a driving transistor which has a source electrode, a drain electrode, and a gate electrode and supplies a driving current to the electroluminescent device; a compensation transistor which is configured to connect the drain electrode and the gate electrode of the driving transistor in accordance with a first scan signal supplied from the driver; a first bias transistor which is configured to apply a first bias voltage to the drain electrode of the driving transistor in accordance with a second scan signal supplied from the driver; and a second bias transistor which is configured to apply a second bias voltage to the pixel electrode of the electroluminescent device in accordance with the second scan signal supplied from the driver. The first bias voltage has a first voltage and a second voltage higher than the first voltage in an on-bias stress phase. In the on-bias stress phase, the compensation transistor performs an off-operation, and the first and the second bias transistors perform an on-operation. Before and after switching from the first refresh rate to the second refresh rate, the second voltage of the first bias voltage or the second bias voltage is dynamically controlled.

Yet another embodiment is a display driving driver. One frame which is divided into a refresh section in which a data voltage is written and a hold section in which the data voltage written in the refresh section is maintained. The frame controls dynamically a first bias voltage and a second bias voltage before and after switching from a first refresh rate to a second refresh rate. The first bias voltage is applied to a drain electrode of a driving transistor. The second bias voltage is applied to a pixel electrode of an electroluminescent device.

The second voltage of the first bias voltage is controlled to a voltage higher by a first level in a first refresh frame period after switching to the second refresh rate.

The second voltage of the first bias voltage is controlled to a voltage higher by a second level lower than the first level in a refresh frame period after the first refresh frame period after switching to the second refresh rate.

The second bias voltage is controlled to a voltage lower by a first level in a first refresh frame period after switching to the second refresh rate.

The second voltage of the first bias voltage is controlled to a voltage lower by a first level in the hold frame period after switching to the second refresh rate.

The second bias voltage is controlled to a voltage higher by the first level in the hold frame period after switching to the second refresh rate.

The second bias voltage is controlled to a voltage higher by the first level in the hold frame period immediately before switching to the second refresh rate.

After switching to the second refresh rate, the second voltage of the first bias voltage is controlled to a voltage higher by a first level in the refresh frame period and is controlled to a voltage lower by the first level in the hold frame period.

The second voltage of the first bias voltage is controlled to a voltage higher by a first level in the hold frame period immediately before switching to the second refresh rate.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
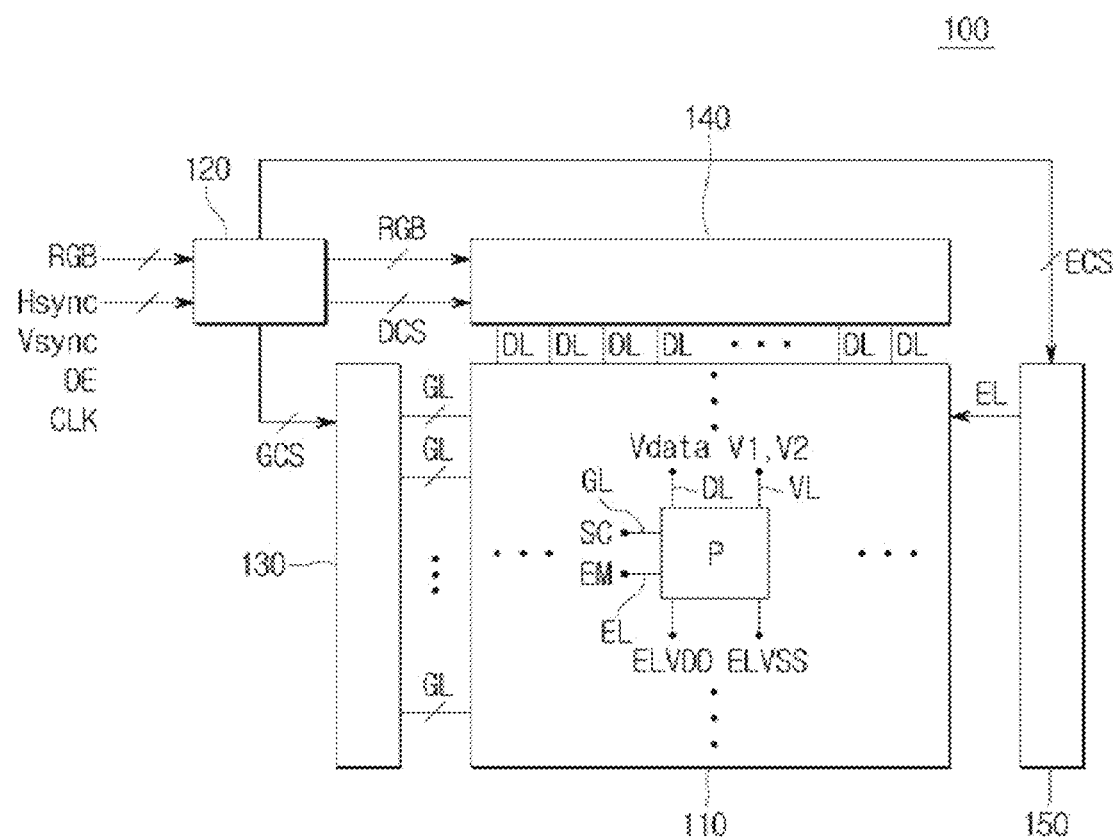
FIG. 1 is a block diagram showing schematically an electroluminescent display device according to an embodiment of the present invention.

The features, advantages and method for accomplishment of the present invention will be more apparent from referring to the following detailed embodiments described as well as the accompanying drawings. However, the present invention is not limited to the embodiment to be disclosed below and is implemented in different and various forms. The embodiments bring about the complete disclosure of the present invention and are only provided to make those skilled in the art fully understand the scope of the present invention. The present invention is just defined by the scope of the appended claims. The same reference numerals throughout the disclosure correspond to the same elements.

What one component is referred to as being "connected to" or "coupled to" another component includes both a case where one component is directly connected or coupled to another component and a case where a further another component is interposed between them. Meanwhile, what one component is referred to as being "directly connected to" or "directly coupled to" another component indicates that a further another component is not interposed between them. The term "and/or" includes each of the mentioned items and one or more all of combinations thereof.

Terms used in the present specification are provided for description of only specific embodiments of the present invention, and not intended to be limiting. In the present specification, an expression of a singular form includes the expression of plural form thereof if not specifically stated. The terms "comprises" and/or "comprising" used in the specification is intended to specify characteristics, numbers, steps, operations, components, parts or any combination thereof which are mentioned in the specification, and intended not to exclude the existence or addition of at least one another characteristics, numbers, steps, operations, components, parts or any combination thereof.

While terms such as the first and the second, etc., can be used to describe various components, the components are not limited by the terms mentioned above. The terms are used only for distinguishing between one component and other components.

Therefore, the first component to be described below may be the second component within the spirit of the present invention. Unless differently defined, all terms used herein including technical and scientific terms have the same meaning as commonly understood by one of ordinary skill in the art to which the present invention belongs. Also, commonly used terms defined in the dictionary should not be ideally or excessively construed as long as the terms are not clearly and specifically defined in the present application.

The term "module" or "part" used in this specification may mean software components or hardware components such as a field programmable gate array (FPGA), an application specific integrated circuit (ASIC). The "part" or "module" performs certain functions. However, the "part" or "module" is not meant to be limited to software or hardware. The "part" or "module" may be configured to be placed in an addressable storage medium or to restore one or more processors. Thus, for one example, the "part" or "module" may include components such as software components, object-oriented software components, class components, and task components, and may include processes, functions, attributes, procedures, subroutines, segments of a program code, drivers, firmware, microcode, circuits, data, databases, data structures, tables, arrays, and variables. Components and functions provided in the "part" or "module" may be combined with a smaller number of components and "parts" or "modules" or may be further divided into additional components and "parts" or "modules".

Methods or algorithm steps described relative to some embodiments of the present disclosure may be directly implemented by hardware and software modules that are executed by a processor or may be directly implemented by a combination thereof. The software module may be resident on a RAM, a flash memory, a ROM, an EPROM, an EEPROM, a resistor, a hard disk, a removable disk, a CD-ROM, or any other type of record medium known to those skilled in the art. An exemplary record medium is coupled to a processor and the processor can read information from the record medium and can record the information in a storage medium. In another way, the record medium may be integrally formed with the processor. The processor and the record medium may be resident within an application specific integrated circuit (ASIC). The ASIC may be resident within a user's terminal.

FIG. 1 is a block diagram showing schematically an electroluminescent display device according to an embodiment of the present invention.

Referring to FIG. 1, the electroluminescent display device 100 includes a display panel 110 including a plurality of pixels, a gate driver 130 supplying a gate signal to each of the plurality of pixels, a data driver 140 supplying a data signal to each of the plurality of pixels, an light emission signal generator 150 supplying a light emission signal to each of the plurality of pixels and a timing controller 120.

The timing controller 120 processes an image data RGB input from the outside appropriately for the size and resolution of the display panel 110 and provides it to the data driver 140. The timing controller 120 generates a plurality of gate control signals GCS, a plurality of data control signals DCS, and a plurality of light emission control signals ECS by using synchronization signals SYNC input from the outside, for example, a dot clock signal CLK, a data-enable signal DE, a horizontal synchronization signal Hsync, and a vertical synchronization signal Vsync. By providing the plurality of generated gate, data, and light emission control signals GCS, DCS, and ECS to the gate driver 130, the data driver 140, and the light emission signal generator 150, respectively, the timing controller 120 controls the gate driver 130, the data driver 140, and the light emission signal generator 150.

The timing controller 120 may be coupled to various processors, for example, a microprocessor, a mobile processor, an application processor, etc., according to a mounted device.

The timing controller 120 generates a signal such that the pixel can be driven at various refresh rates. That is, the timing controller 120 generates signals related to driving such that the pixels are driven in a variable refresh rate VRR mode or driven to be switchable between a first refresh rate and a second refresh rate. For example, the timing controller 120 simply changes the speed of a clock signal, generates a synchronization signal to generate a horizontal blank or a vertical blank, or drives the gate driver 130 in a mask method, thereby driving the pixel at various refresh rates.

Also, the timing controller 120 generates various signals for driving a pixel driving circuit at the first refresh rate. Particularly, when the pixel driving circuit is driven at the first refresh rate, the timing controller 120 generates the light emission control signal ECS in order that the light emission signal generator 150 generates a light emission signal EM having a first duty ratio. Then, the timing controller 120 operates to drive the pixel driving circuit at the second refresh rate, and, to this end, generates various signals for driving at the second refresh rate. In particular, when the pixel driving circuit is driven at the second refresh rate, the light emission signal generator 150 generates the light emission control signal ECS in order that the light emission signal generator 150 generates the light emission signal EM having a second duty ratio different from the first duty ratio.

The gate driver 130 provides scan signals SC to gate lines GL in accordance with the gate control signal GCS provided from the timing controller 120. In FIG. 1, the gate driver 130 is shown to be arranged apart from one side of the display panel 110. However, the number and arrangement position of the gate driver 130 are not limited thereto. That is, the gate driver 130 may be disposed on one side or both sides of the display panel 110 in a Gate In Panel (GIP) method.

The data driver 140 converts the image data RGB into a data voltage Vdata in accordance with the data control signal DCS provided from the timing controller 120, and supplies the converted data voltage Vdata to the pixel through a data line DL.

In the display panel 110, a plurality of gate lines GL, a plurality of light emission lines EL, and a plurality of data lines DL cross each other, and each of the plurality of pixels is connected to the gate line GL, the light emission line EL, and the data line DL. Specifically, one pixel receives the gate signal from the gate driver 130 through the gate line GL, receives the data signal from the data driver 140 through the data line DL, and receives the light emission signal EM through the light emission line EL, and receives various power through a power supply line. Here, the gate line GL provides the scan signal SC, the light emission lines EL provides the light emission signal EM, and the data line DL supplies the data voltage Vdata. However, according to various embodiments, the gate line GL may include a plurality of scan signal lines, and the data line DL may further include a plurality of power supply lines VL. Also, the light emission line EL may also include a plurality of light emission signal lines. Also, one pixel receives a high potential voltage ELVDD and a low potential voltage ELVSS. Also, one pixel may receive a first and a second bias voltage V1 and V2 through the plurality of power supply lines VL.

Further, each of the pixels includes an electroluminescent device and a pixel driving circuit that controls the driving of the electroluminescent device. Here, the electroluminescent device includes an anode, a cathode, and an organic light emitting layer between the anode and the cathode. The pixel driving circuit includes a plurality of switching elements, driving switching elements, and capacitors. Here, the switching element may be composed of a TFT. In the pixel driving circuit, a driving TFT controls the amount of current supplied to the electroluminescent device in accordance with a difference between a reference voltage and the data voltage charged in the capacitor, and controls the amount of light emission of the electroluminescent device. Also, a plurality of switching TFTs receive the scan signal SC supplied through the gate line GL and the light emission signal EM supplied through the light emission line EL, and charge the data voltage Vdata in the capacitor.

The electroluminescent display device 100 according to the embodiment of the present invention includes the gate driver 130, the data driver 140, and the light emission signal generator 150, which are for driving the display panel 110 including the plurality of pixels, and the timing controller 120 for controlling them. Here, the light emission signal generator 150 is configured to be able to control the duty ratio of the light emission signal EM. For example, the light emission signal generator 150 may include a shift register, a latch, etc., for controlling the duty ratio of the light emission signal EM. The light emission signal generator 150 may be configured to generate the light emission signal having the first duty ratio and to provide it to the pixel driving circuit, when the pixel driving circuit is driven at the first refresh rate in accordance with the light emission control signal ECS generated by the timing controller 120, and may be configured to generate the light emission signal having the second duty ratio different from the first duty ratio and to provide it to the pixel driving circuit, when the pixel driving circuit is driven at the second refresh rate.

Figure 2A:
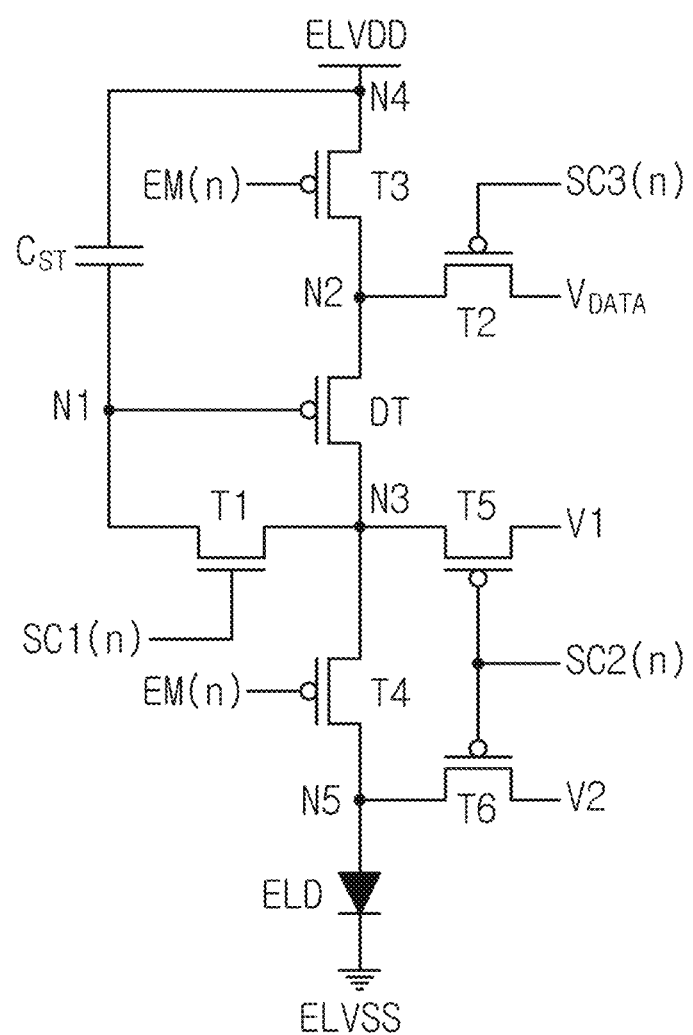
FIGS. 2A to 2C are circuit diagrams of a pixel circuit of the electroluminescent display device according to the embodiment of the present invention.
Figure 2B:
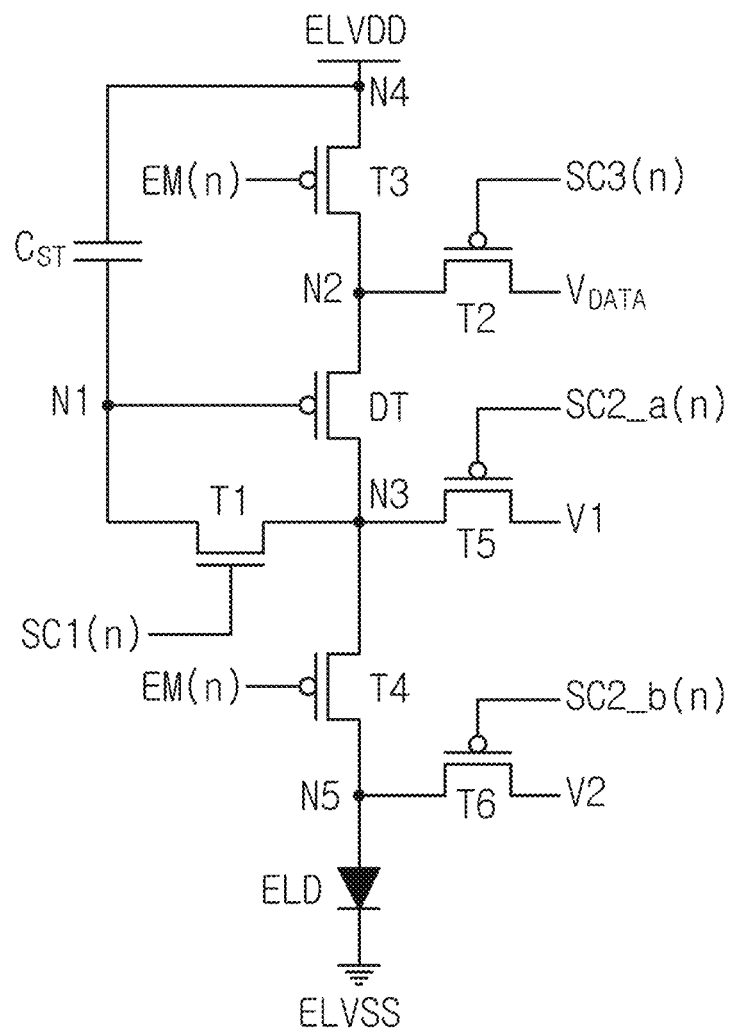
Figure 2C:
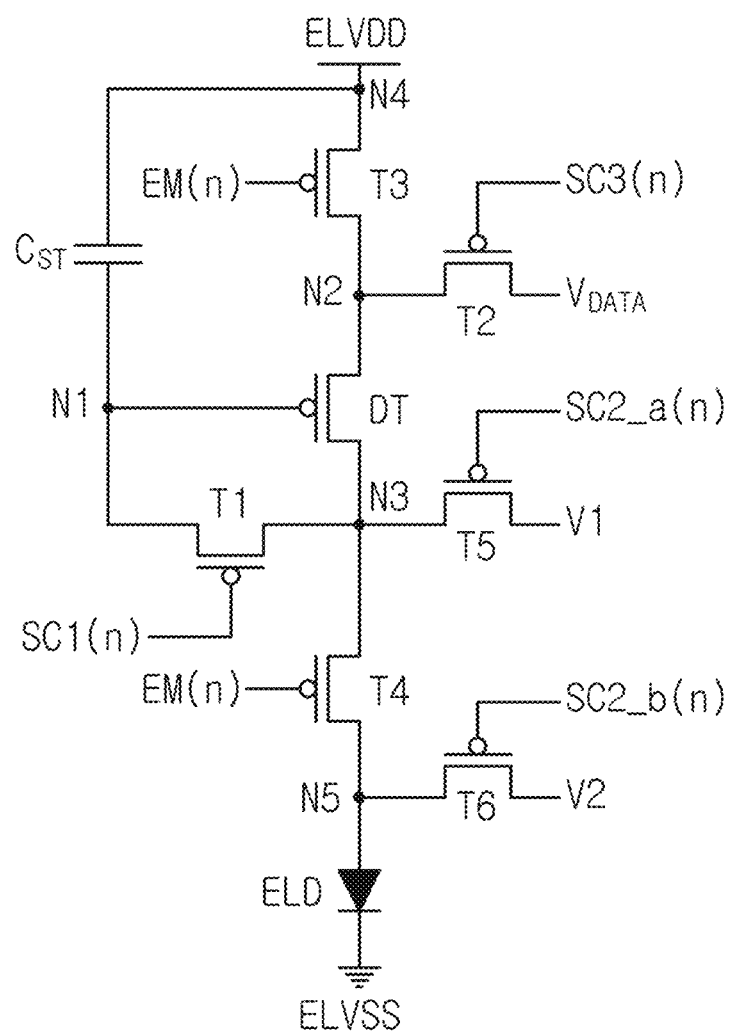

FIGS. 2A to 2C are circuit diagrams of a pixel circuit of the electroluminescent display device according to the embodiment of the present invention.

FIGS. 2A to 2C illustratively show the pixel driving circuit for description, and there is no limitation as long as the pixel driving circuit has a structure which is provided with the light emission signal EM and is capable of controlling the light emission of the electroluminescent device ELD. For example, the pixel driving circuit may include an additional scan signal, a switching TFT connected to the scan signal, and a switching TFT to which an additional initialization voltage is applied. Also, a connection relationship between switching elements or a connection position of the capacitor may be variously arranged. That is, since the light emission of the electroluminescent device ELD is controlled according to the change in the duty ratio of the light emission signal EM, as long as the light emission can be controlled according to the refresh rate, the pixel driving circuit having various structures may be used. For example, various pixel driving circuits such as 3T1C, 4T1C, 6T1C, 7T1C, and 7T2C or the like may be used. Hereinafter, for convenience of description, the electroluminescent display device having a pixel driving circuit of 7T1C of FIG. 2 will be described.

Referring to FIG. 2A, each of the plurality of pixels P may include a pixel circuit PC having a driving transistor DT, and the electroluminescent device ELD connected to the pixel circuit PC.

The pixel circuit PC may drive the electroluminescent device ELD by controlling a driving current Id flowing through the electroluminescent device ELD. The pixel circuit PC may include the driving transistor DT, first to sixth transistors T1 to T6, and a storage capacitor Cst. Each of the transistors DT and T1 to T6 may include a first electrode, a second electrode, and a gate electrode. One of the first electrode and the second electrode may be a source electrode, and the other of the first electrode and the second electrode may be a drain electrode.

Each of the transistors DT and T1 to T6 may be a PMOS transistor or an NMOS transistor. In the embodiments of FIGS. 2A and 2B, the first transistor T1 is an NMOS transistor, and the other transistors DT and T2 to T6 are PMOS transistors. Further, in the embodiment of FIG. 2C, the first transistor T1 is also composed of a PMOS transistor.

Hereinafter, a case where the first transistor T1 is an NMOS transistor and the other transistors DT and T2 to T6 are PMOS transistors will be described as an example. Accordingly, the first transistor T1 is turned on by being applied with a high voltage, and the other transistors DT and T2 to T6 are turned on by being applied with a low voltage.

According to an example, the first transistor T1 constituting the pixel circuit PC may function as a compensation transistor, the second transistor T2 may function as a data supply transistor, the third and fourth transistors T3 and T4 may function as light emission control transistors, and the fifth and sixth transistors T5 and T6 may function as bias transistors.

The electroluminescent device ELD may include a pixel electrode (or an anode electrode) and a cathode electrode. The pixel electrode of the electroluminescent device ELD may be connected to a fifth node N5, and the cathode electrode may be connected to a second power supply voltage ELVSS.

The driving transistor DT may include the first electrode connected to a second node N2, the second electrode connected to a third node N3, and the gate electrode connected to a first node N1. The driving transistor DT may provide the driving current Id to the electroluminescent device ELD on the basis of the voltage of the first node N1 (or the data voltage stored in the capacitor Cst to be described later).

The first transistor T1 may include the first electrode connected to the first node N1, the second electrode connected to the third node N3, and the gate electrode which receives a first scan signal SC1. The first transistor T1 may be turned on in response to the first scan signal SC1 and may transmit the data signal Vdata to the first node N1. The first transistor T1 is diode-connected between the first node N1 and the third node N3, thereby sampling a threshold voltage Vth of the driving transistor DT. The first transistor T1 may be a compensation transistor.

The capacitor Cst may be connected or formed between the first node N1 and a fourth node N4. The capacitor Cst may store or maintain the provided data signal Vdata.

The second transistor T2 may include the first electrode connected to the data line DL (or receiving the data signal Vdata), the second electrode connected to the second node N2, and the gate electrode which receives a third scan signal SC3. The second transistor T2 may be turned on in response to the third scan signal SC3 and may transmit the data signal Vdata to the second node N2. The second transistor T2 may be a data supply transistor.

The third transistor T3 and the fourth transistor T4 (or the first and second light emission control transistors) may be connected between a first power supply voltage ELVDD and the electroluminescent device ELD, and may form a current moving path through which the driving current Id which is generated by the driving transistor DT moves.

The third transistor T3 may include the first electrode which is connected to the fourth node N4 and receives the first power supply voltage ELVDD, the second electrode which is connected to the second node N2, and the gate electrode which receives the light emission signal EM.

Similarly, the fourth transistor T4 may include the first electrode which is connected to the third node N3, the second electrode which is connected to the fifth node N5 (or the pixel electrode of the electroluminescent device ELD), and the gate electrode which receives the light emission signal EM.

The third and fourth transistors T3 and T4 are turned on in response to the light emission signal EM. In this case, the driving current Id is supplied to the electroluminescent device ELD, and the electroluminescent device ELD can emit light with a luminance corresponding to the driving current Id.

The fifth transistor T5 includes the first electrode which is connected to the third node N3, the second electrode which receives the first bias voltage V1, and the gate electrode which receives a second scan signal SC2.

The sixth transistor T6 may include the first electrode which is connected to the fifth node N5, the second electrode which receives the second bias voltage V2, and the gate electrode which receives the second scan signal SC2. In FIG. 2A, the gate electrodes of the fifth and sixth transistors T5 and T6 are configured to receive the second scan signal SC2 in common. However, the present invention is not necessarily limited thereto, and, as shown in FIGS. 2B and 2C, the gate electrodes of the fifth and sixth transistors T5 and T6 may be configured to receive separate scan signals and to be controlled independently, respectively.

The sixth transistor T6 may include the first electrode which is connected to the fifth node N5, the second electrode which is connected to the second bias voltage V2, and the gate electrode which receives the second scan signal SC2. Before the electroluminescent device ELD emits light (or after the electroluminescent device ELD emits light), the sixth transistor T6 may be turned on in response to the second scan signal SC2 and may initialize the pixel electrode (or anode electrode) of the electroluminescent device ELD by using the second bias voltage V2. The electroluminescent device ELD may have a parasitic capacitor formed between the pixel electrode and the cathode electrode. Also, while the electroluminescent device ELD emits light, the parasitic capacitor is charged so that the pixel electrode of the electroluminescent device ELD may have a specific voltage. Accordingly, by applying the second bias voltage V2 to the pixel electrode of the electroluminescent device ELD through the sixth transistor T6, the amount of charge accumulated in the electroluminescent device ELD can be initialized.

The present disclosure relates to the electroluminescent display device using a variable refresh rate (VRR) mode. The VRR is a technology that drives the display device at a constant frequency and activates pixels by increasing the refresh rate at which the data voltage Vdata is updated when high-speed driving is required, and drives pixels by reducing the refresh rate when it is necessary to reduce power consumption or low-speed driving is required.

Each of the plurality of pixels P may be driven through a combination of a refresh frame and a hold frame within one second. In this specification, one set is defined as that the refresh frame in which the data voltage Vdata is updated is repeated. Also, one set period is a cycle in which the refresh frame in which the data voltage Vdata is updated is repeated.

When the display device is driven at the refresh rate of 120 Hz, the display device can be driven only by the refresh frame. That is, the refresh frame can be driven 120 times within one second. One refresh frame period is 1/120=8.33 ms, and one set period is also 8.33 ms.

When the display device is driven at the refresh rate of 60 Hz, the refresh frame and the hold frame may be alternately driven. That is, the refresh frame and the hold frame may be alternately driven 60 times within one second. One refresh frame period and one hold frame period are 0.5/60=8.33 ms, respectively, and one set period is 16.66 ms.

When the display device is driven at the refresh rate of 1 Hz, one second may be driven with one refresh frame and with 119 hold frames after the one refresh frame. One refresh frame period and one hold frame period are 1/120=8.33 ms, respectively, and one set period is 1 s.

FIGS. 3A to 3K are views for describing the driving of the electroluminescent device and the pixel circuit of the refresh frame in the pixel circuit of the display device shown in FIGS. 2A to 2C.

Figure 4A:
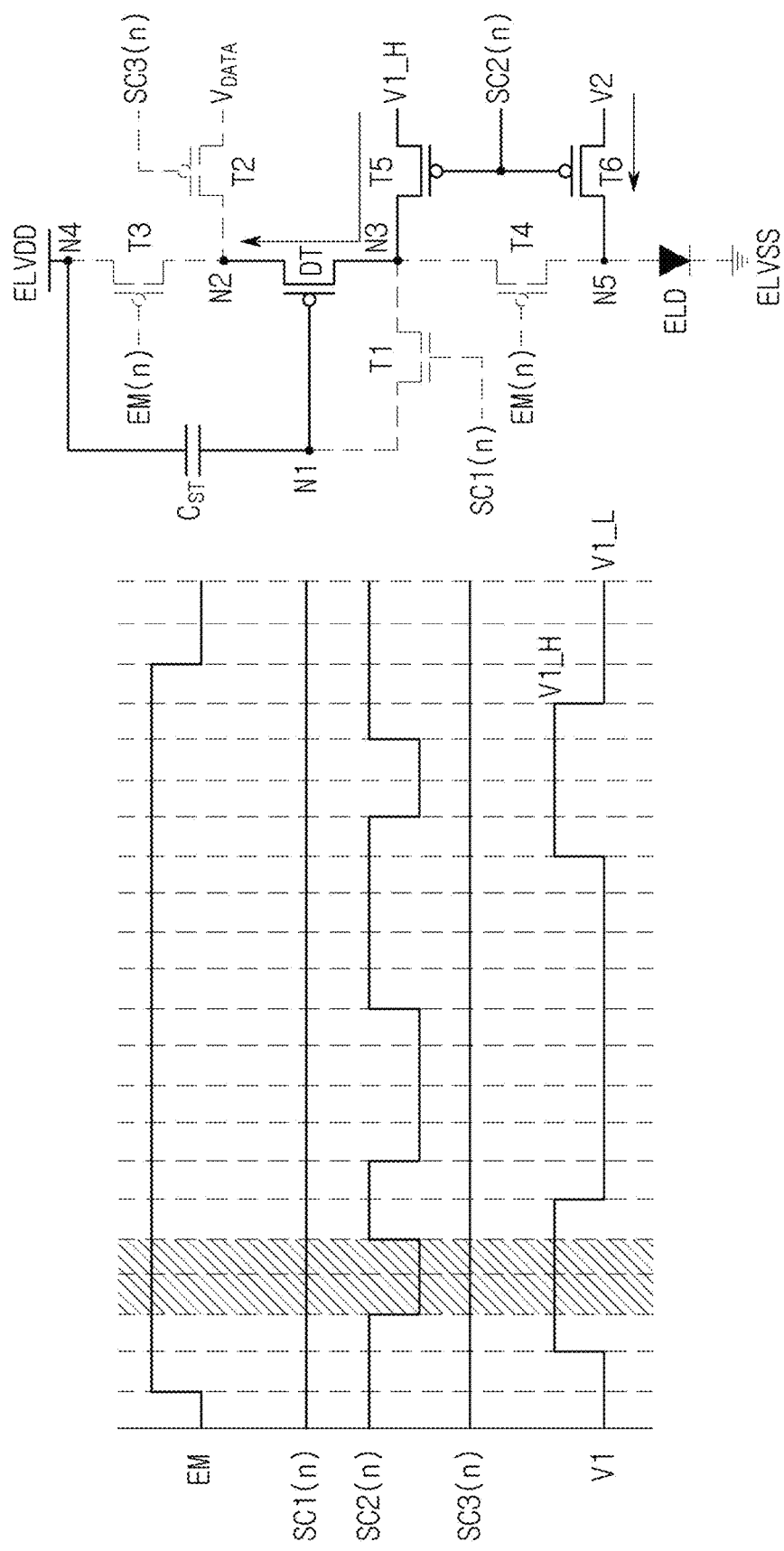
FIGS. 4A to 4C are views for describing the driving of the electroluminescent device and a pixel circuit of a hold frame in the pixel circuit of the display device shown in FIGS. 2A to 2C.
Figure 4B:
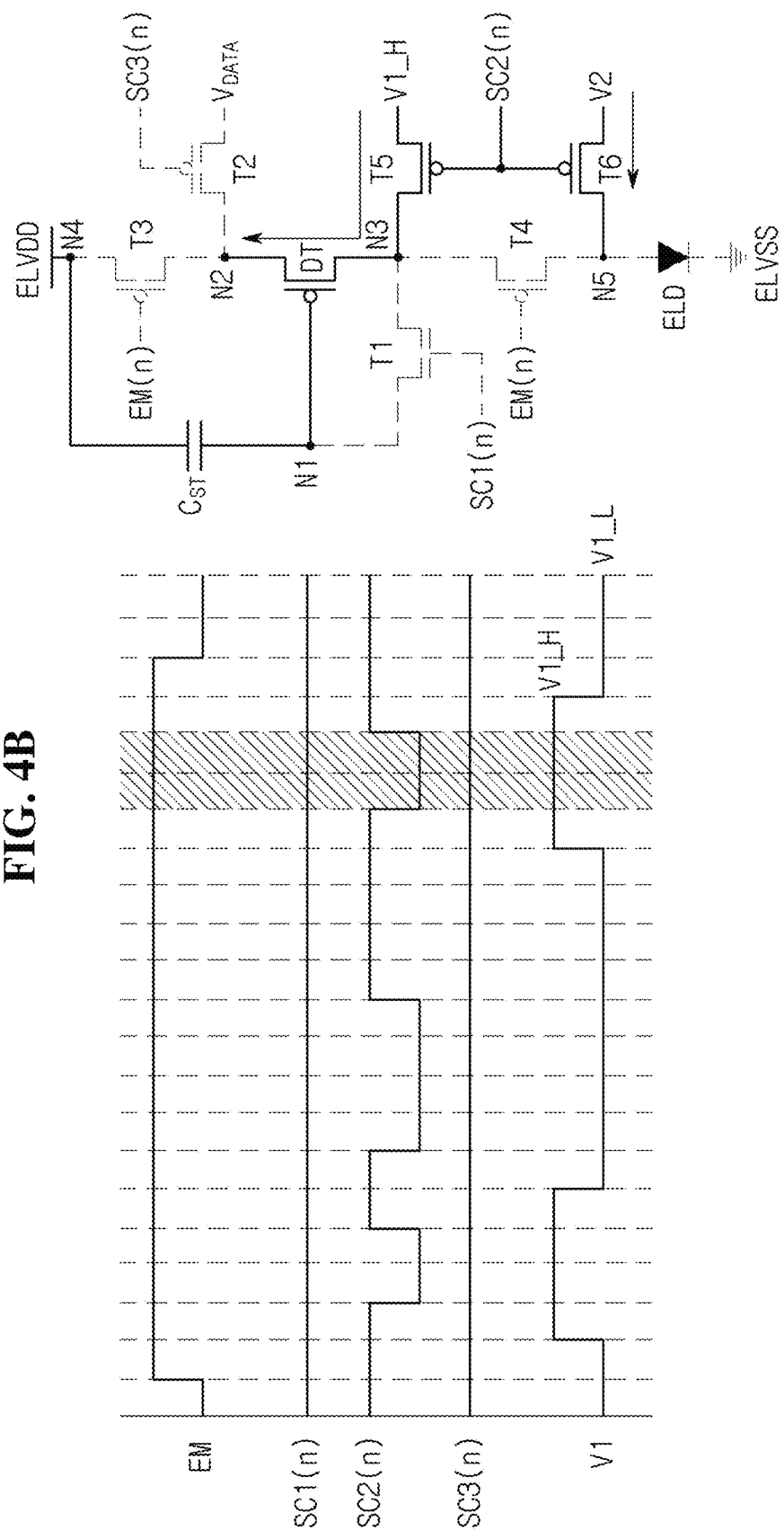
Figure 4C:
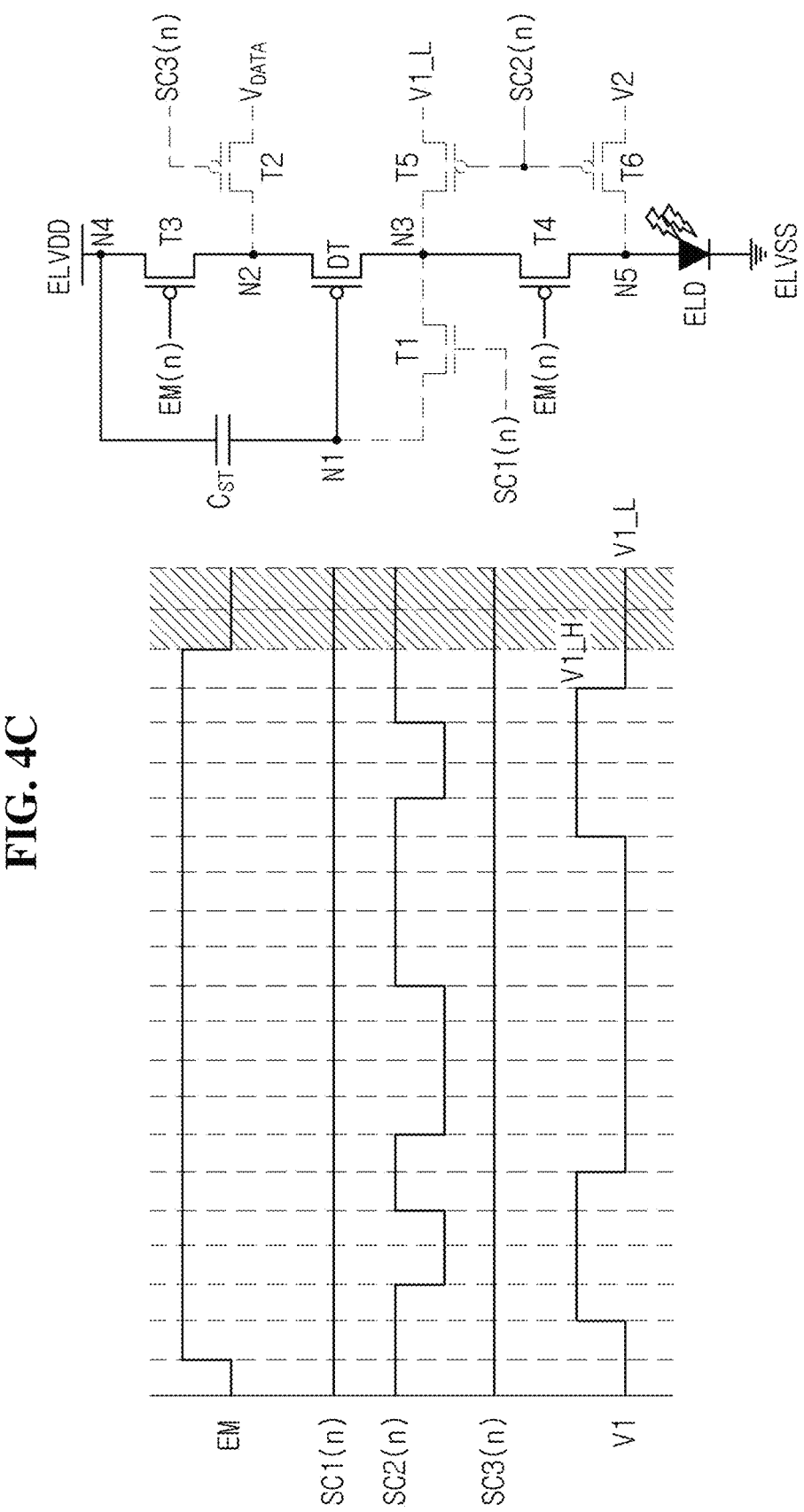

FIGS. 4A to 4C are views for describing the driving of the electroluminescent device and the pixel circuit of the hold frame in the pixel circuit of the display device shown in FIGS. 2A to 2C.

While, in the refresh frame, a new data signal Vdata is charged and applied to the gate electrode of the driving transistor DT, in the hold frame, the data signal Vdata of the previous frame is maintained and used. Meanwhile, the hold frame is also referred to as a skip frame in that the process of applying the new data signal Vdata to the gate electrode of the driving transistor DT is omitted.

Each of the plurality of pixels P may initialize a voltage which is charged or remains in the pixel circuit PC during the refresh period. Specifically, each of the plurality of pixels P may remove the influence of the driving voltage VDD and the data voltage Vdata stored in the previous frame in the refresh frame. Accordingly, each of the plurality of pixels P may display an image corresponding to the new data voltage Vdata in the hold period.

Each of the plurality of pixels P may display the image by providing the driving current Id corresponding to the data voltage Vdata to the electroluminescent device ELD during the hold frame period, and may maintain the turn-on state of the electroluminescent device ELD.

First, the driving of the electroluminescent device and the pixel circuit of the refresh frame will be described with reference to FIGS. 3A to 3K. The refresh frame may include at least one bias section, an initialization section, a sampling section, and a light emission section. However, this is only an embodiment and is not necessarily limited to this order.

Figure 3A:
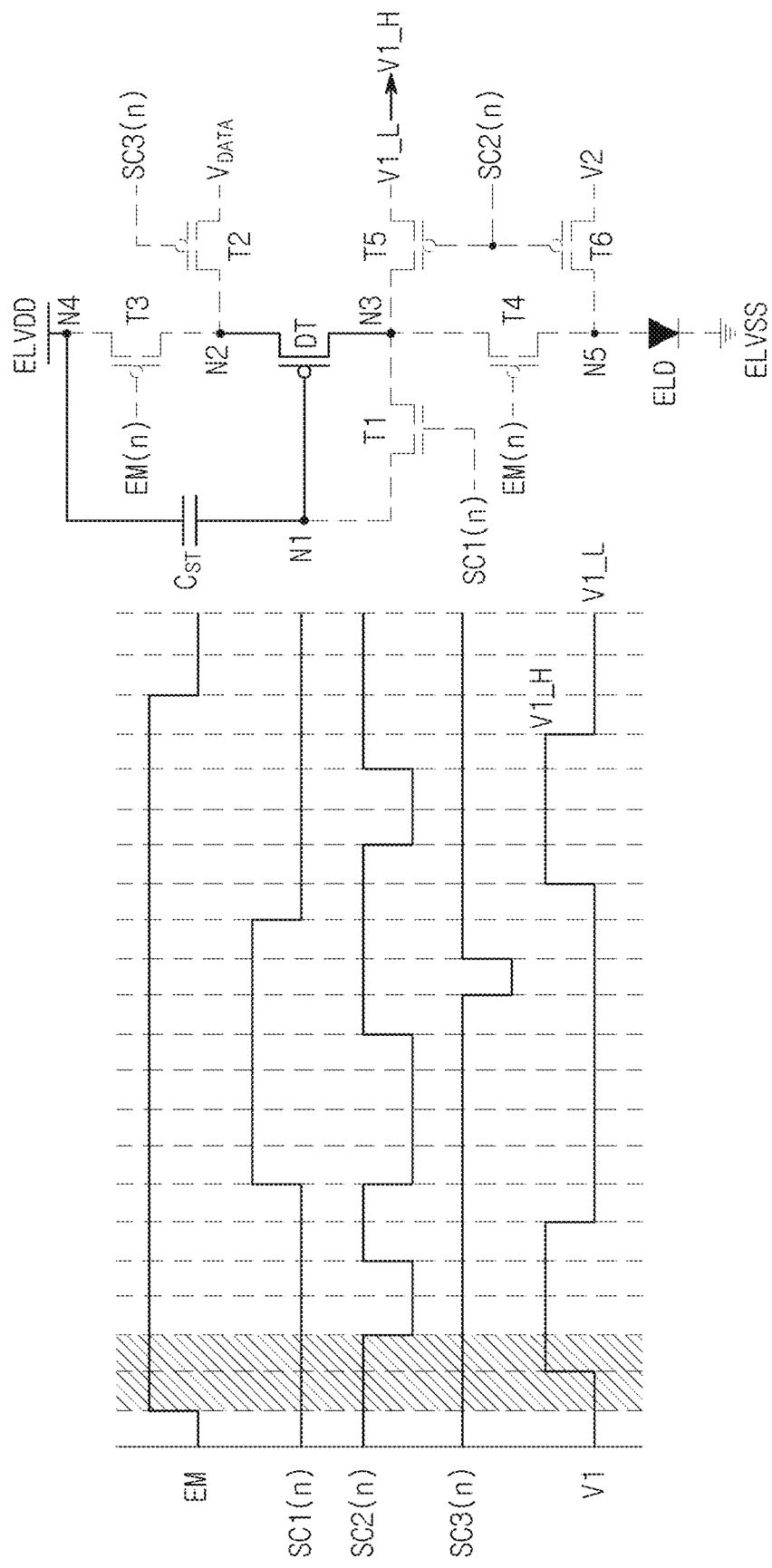
FIGS. 3A to 3K are views for describing the driving of an electroluminescent device and a refresh frame in the pixel circuit of the display device shown in FIGS. 2A to 2C.
Figure 3B:
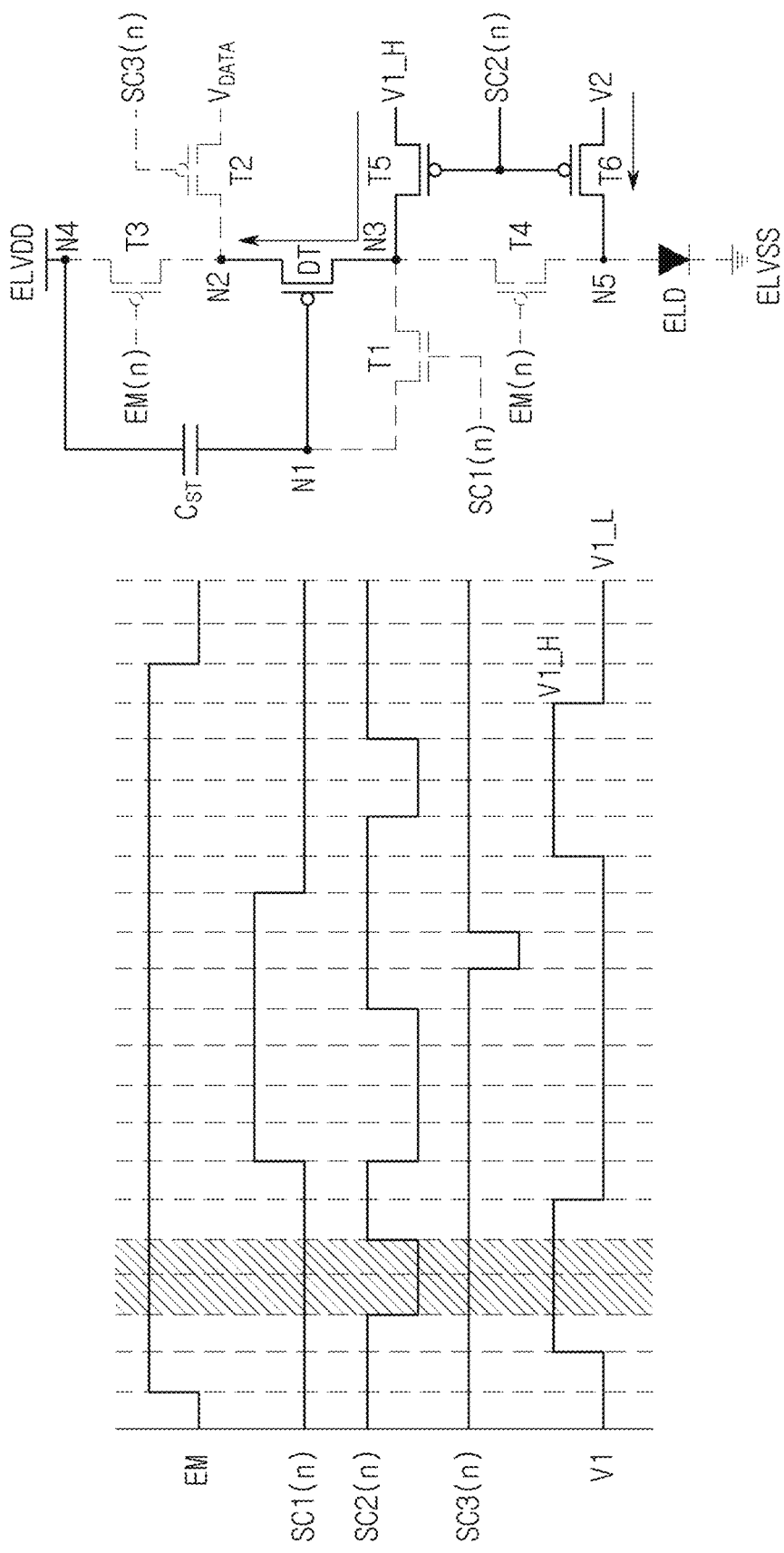
Figure 3C:
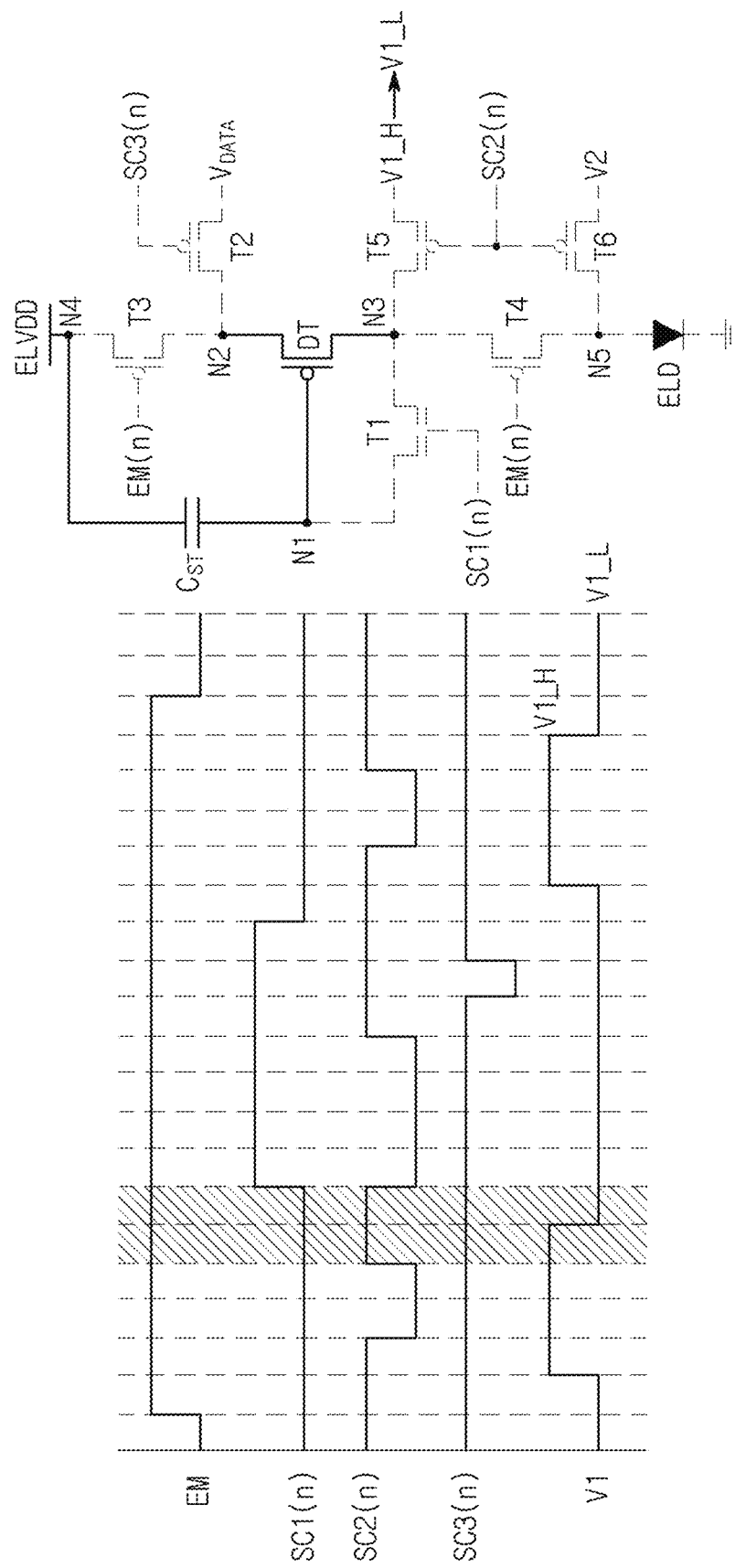

FIGS. 3A to 3C show a first bias section.

In FIG. 3A, a section in which the first bias voltage V1 is changed from a first voltage to a second voltage is shown. State of the light emission signal EM is a high voltage, and the third and fourth transistors T3 and T4 are turned off. The first voltage is represented as V1_L, and the second voltage is represented as V1_H. The V1_H is higher than the V1_L, and it is preferable that the V1_H is higher than the data voltage Vdata. The first scan signal SC1 is a low voltage and the first transistor T1 is turned off. The second and third scan signals SC2 and SC3 are high voltages, and the second, fifth, and sixth transistors T2, T5, and T6 are turned off. The voltage of the gate electrode of the driving transistor DT connected to the first node N1 is Vdata(n−1)−|Vth|, that is, a difference between the data voltage Vdata(n−1) of the previous frame n−1 and the threshold voltage Vth of the driving transistor DT.

In FIG. 3B, state of the second scan signal SC2 is a low voltage, and the fifth and sixth transistors T5 and T6 are turned on. As the fifth transistor T5 is turned on, the first bias voltage V1 (V1_H) is applied to the first electrode of the driving transistor DT connected to the second node N2. The voltage of the first electrode of the driving transistor DT connected to the second node N2 increases to the voltage V1_H. The driving transistor DT may be a PMOS transistor, and in this case, the first electrode may be a source electrode. Here, the voltage Vgs between the gate and the source of the driving transistor DT is Vgs=Vdata(n−1)−|Vth|−V1_H.

Here, the first bias voltage V1=V1_H is supplied to the third node N3, that is the drain electrode of the driving transistor DT, so that the charging time or charging delay of the voltage of the fifth node N5 that is the anode electrode of the electroluminescent device ELD can be reduced in the light emission section. The driving transistor DT maintains a stronger saturation. For example, as the first bias voltage V1=V1_H increases, the voltage of the third node N3 that is the drain electrode of the driving transistor DT may increase and a gate-source voltage or a drain-source voltage of the driving transistor DT may decrease. Therefore, it is preferable that the first bias voltage V1_H is at least higher than the data voltage Vdata. Here, the magnitude of the drain-source current Id passing through the driving transistor DT may be reduced, and the stress of the driving transistor DT is reduced in a positive bias stress situation, thereby eliminating the charging delay of the voltage of the third node N3. In other words, the Vgs of the driving transistor DT is biased to the Vdata before the threshold voltage Vth of the driving transistor DT is sampled, so that hysteresis of the driving transistor DT can be reduced. Accordingly, on-bias stress can be defined as an operation to apply directly a suitable bias voltage (for example, V1=V1_H) to the driving transistor DT during non-light emission periods.

Also, as the sixth transistor T6 is turned on in the first bias section, the pixel electrode (or anode electrode) of the electroluminescent device ELD connected to the fifth node N5 is initialized to the second bias voltage V2. However, the gate electrodes of the fifth and sixth transistors T5 and T6 may be configured to receive separate scan signals and to be controlled independently, respectively. That is, it is not necessarily required to simultaneously apply the bias voltage to the source electrode of the driving transistor DT and the pixel electrode of the electroluminescent device ELD in the first bias section.

In FIG. 3C, the high second scan signal SC2 is input, and the first bias voltage V1 is changed from V1_H to V1_L. As the high second scan signal SC2 is input, the fifth and sixth transistors T5 and T6 are turned off.

Figure 3D:
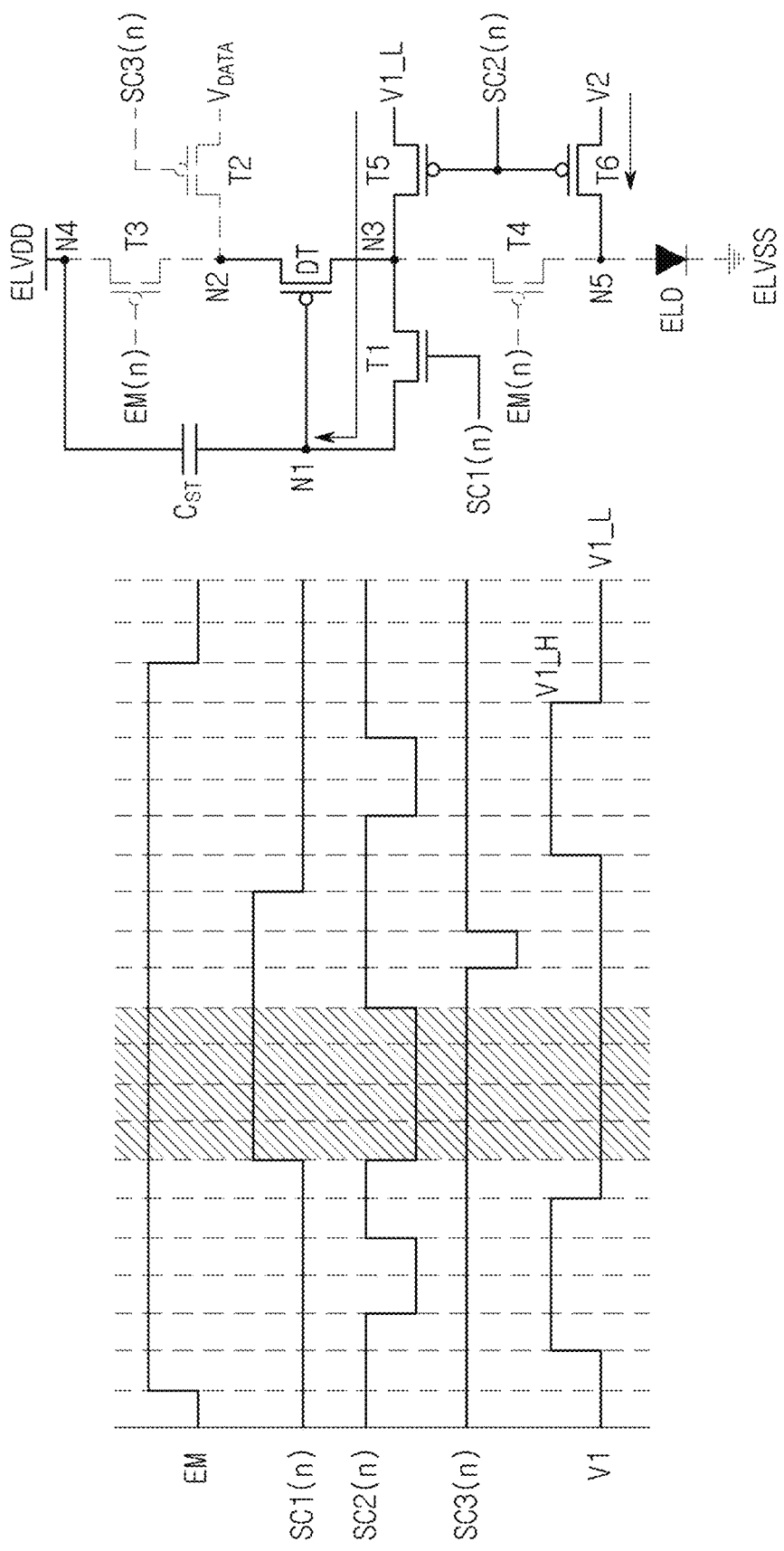

FIG. 3D shows the initialization section. In the initialization section, the voltage of the gate electrode of the driving transistor DT is initialized.

In FIG. 3D, the first scan signal SC1 represents a high voltage, and the first transistor T1 is turned on. The second scan signal SC2 represents a low voltage, and the fifth and sixth transistors T5 and T6 are turned on. As the first and fifth transistors T1 and T5 are turned on, the voltage of the gate electrode of the driving transistor DT connected to the first node N1 is initialized to the voltage V1_L. Also, as the sixth transistor T6 is turned on, the pixel electrode (or anode electrode) of the electroluminescent device ELD is initialized to the second bias voltage V2. However, as described above, the gate electrodes of the fifth and sixth transistors T5 and T6 may be configured to receive separate scan signals and to be controlled independently, respectively. That is, it is not necessarily required to simultaneously apply the bias voltage to the gate electrode of the driving transistor DT and the pixel electrode of the electroluminescent device ELD in the initialization section.

Figure 3E:
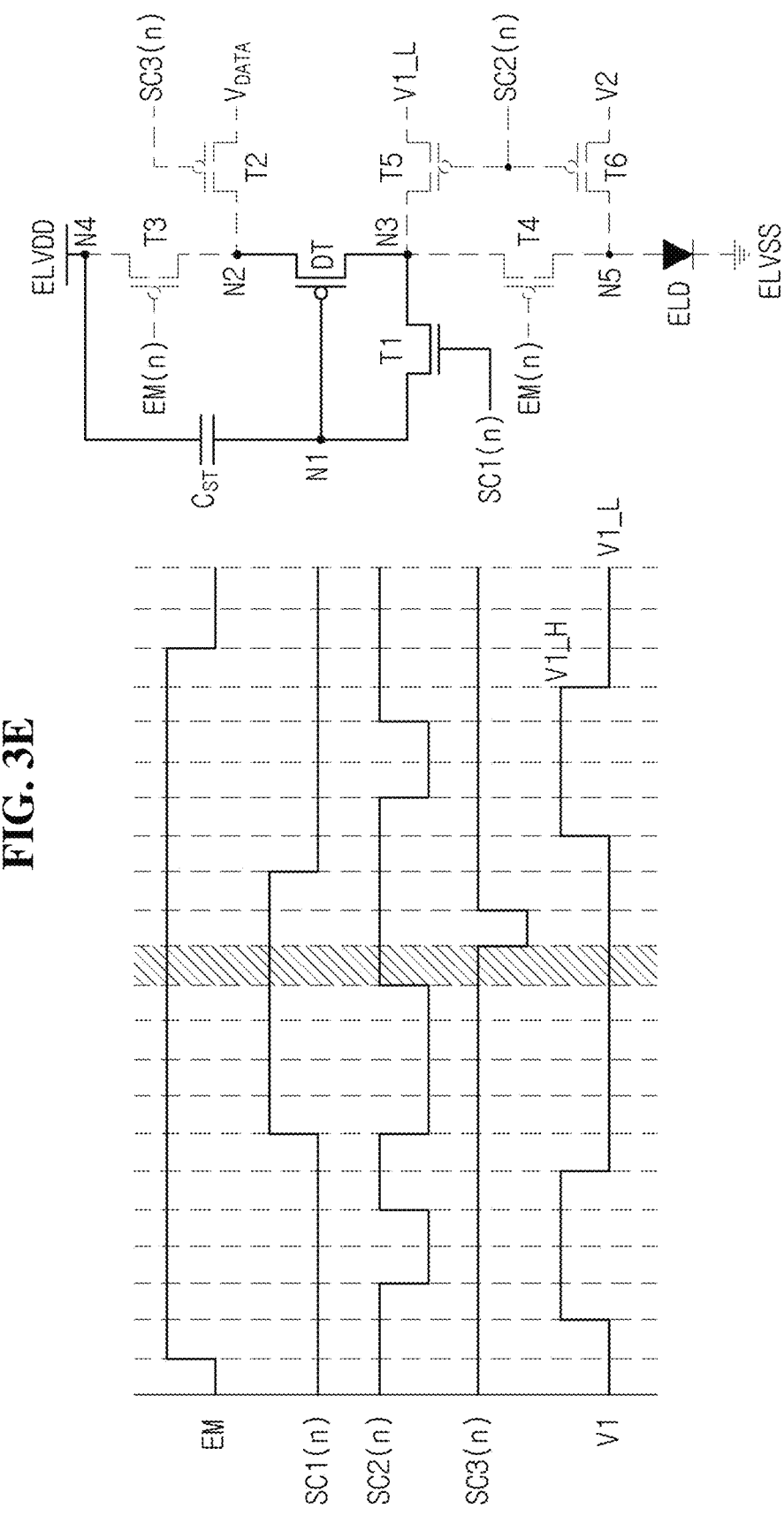
Figure 3F:
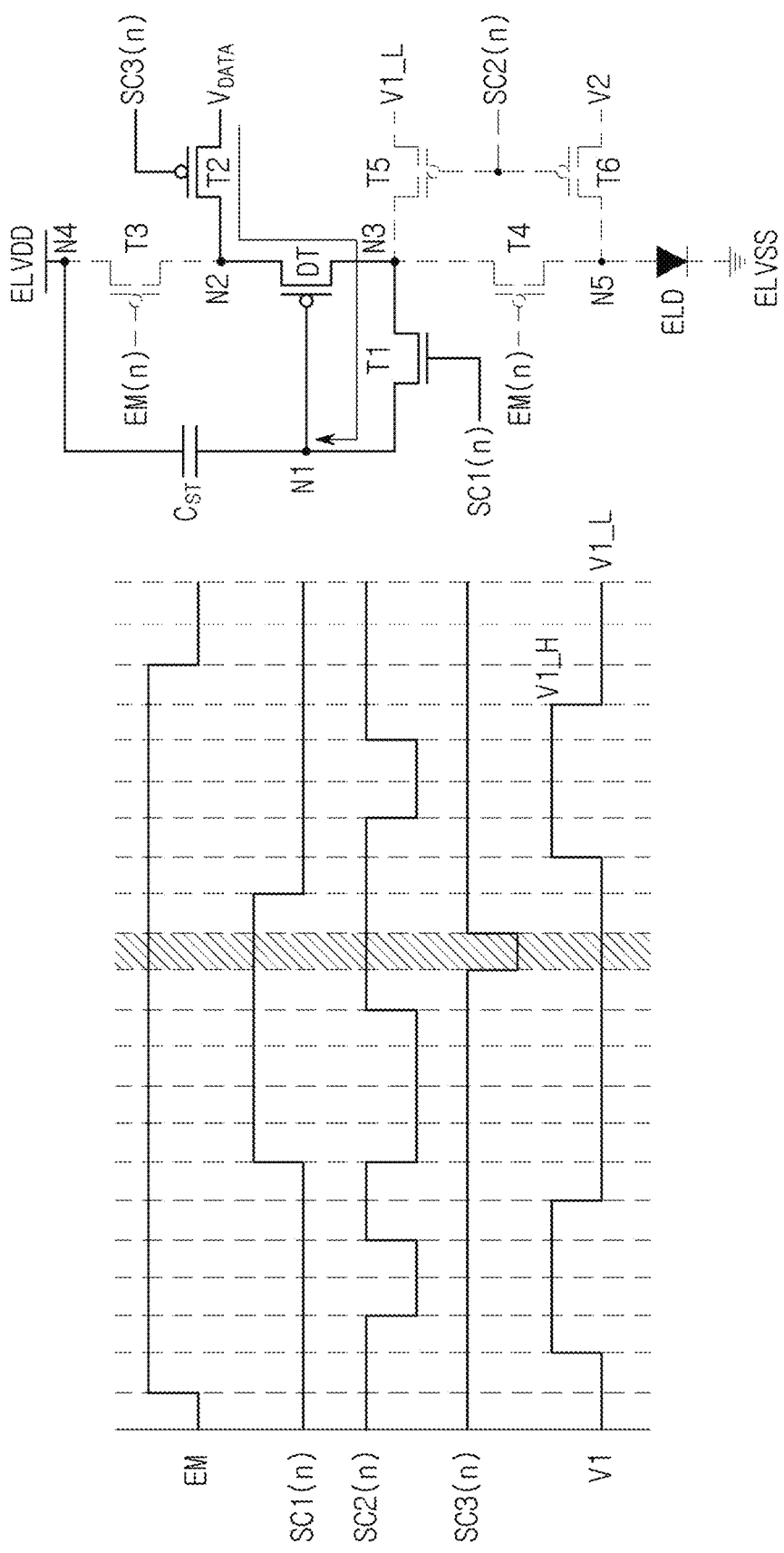
Figure 3G:
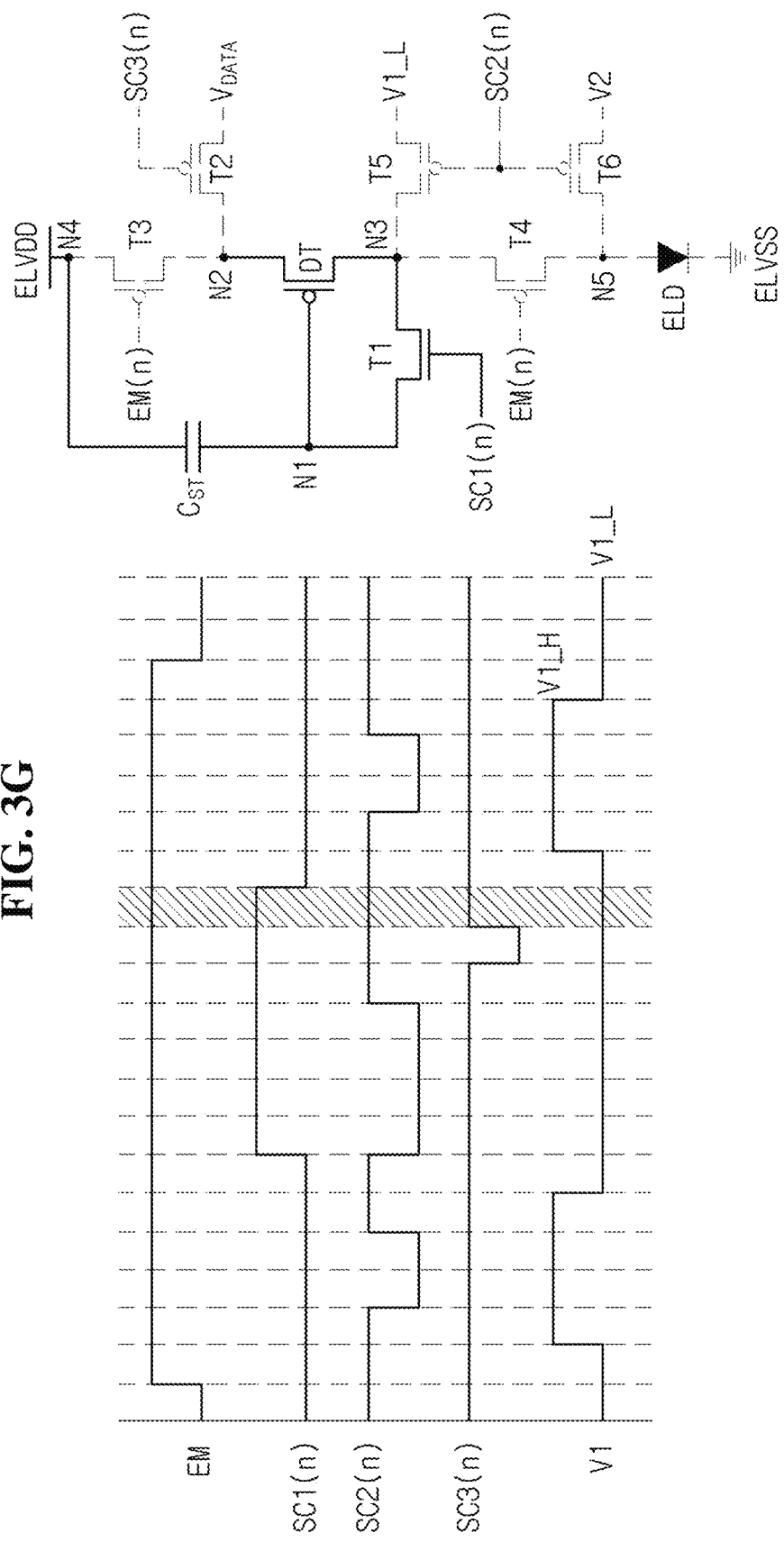

FIGS. 3E to 3G show sampling sections. In the sampling section, the data voltage and the threshold voltage Vth of the driving transistor DT are sampled and stored in the first node N1.

In FIG. 3E, the high second scan signal SC2 is input, and the fifth and sixth transistors T5 and T6 are turned off. The first transistor T1 maintains an on-state.

In FIG. 3F, the low third scan signal SC3 is input, and the second transistor T2 is turned on. As the second transistor T2 is turned on, the voltage of Vdata(n) of the current frame n is applied to the source electrode of the driving transistor DT connected to the second node N2. Also, the first transistor T1 maintains an on-state. Since the driving transistor DT is diode-connected in the state where the first transistor T1 is turned on, the voltage of the gate electrode of the driving transistor DT connected to the first node N1 is Vdata(n)−|Vth|. That is, the first transistor T1 is diode-connected between the first node N1 and the third node N3, thereby sampling the threshold voltage Vth of the driving transistor DT.

In FIG. 3G, the high third scan signal SC3 is input, and the second transistor T2 is turned off.

Figure 3H:
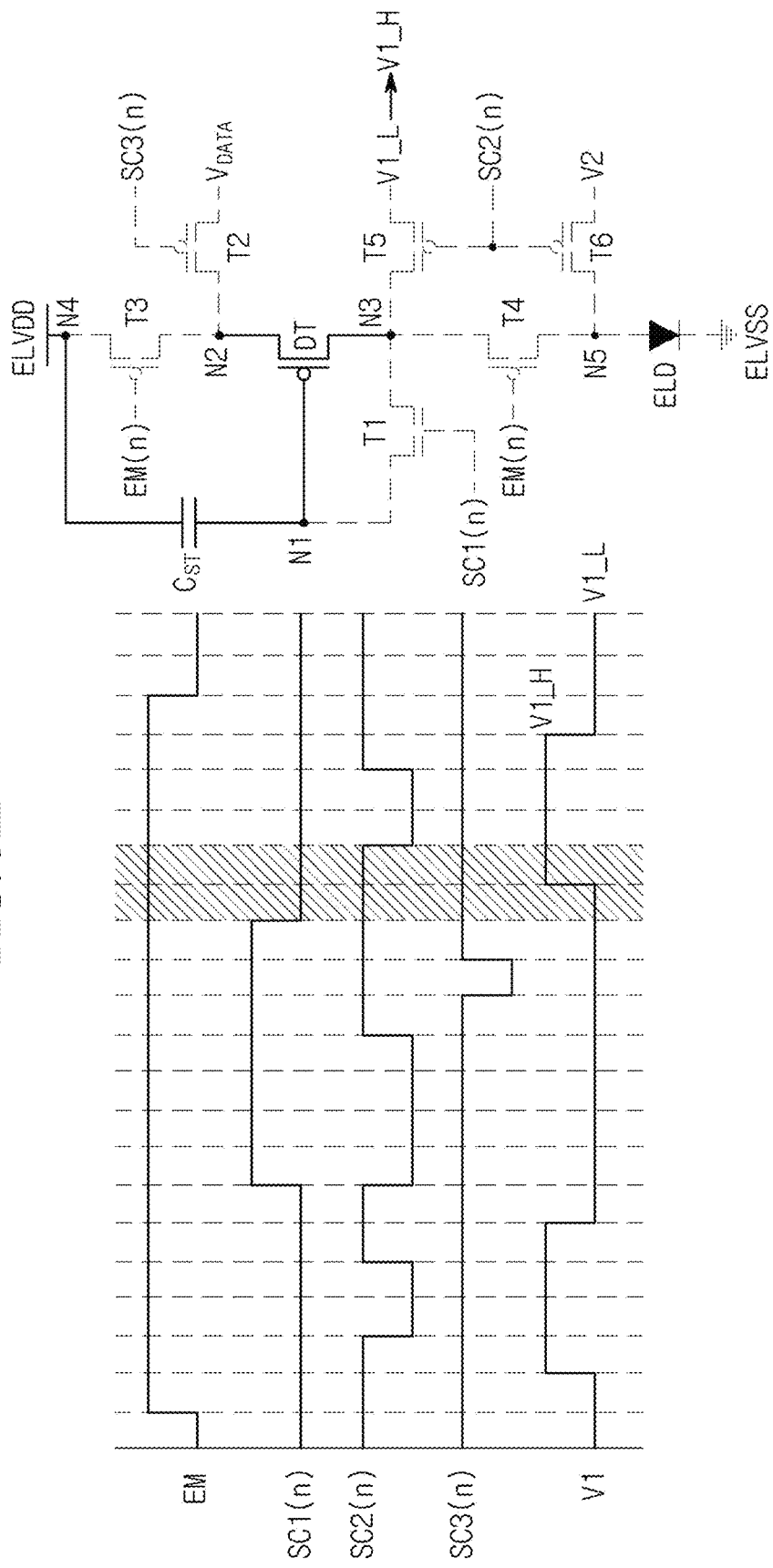
Figure 3I:
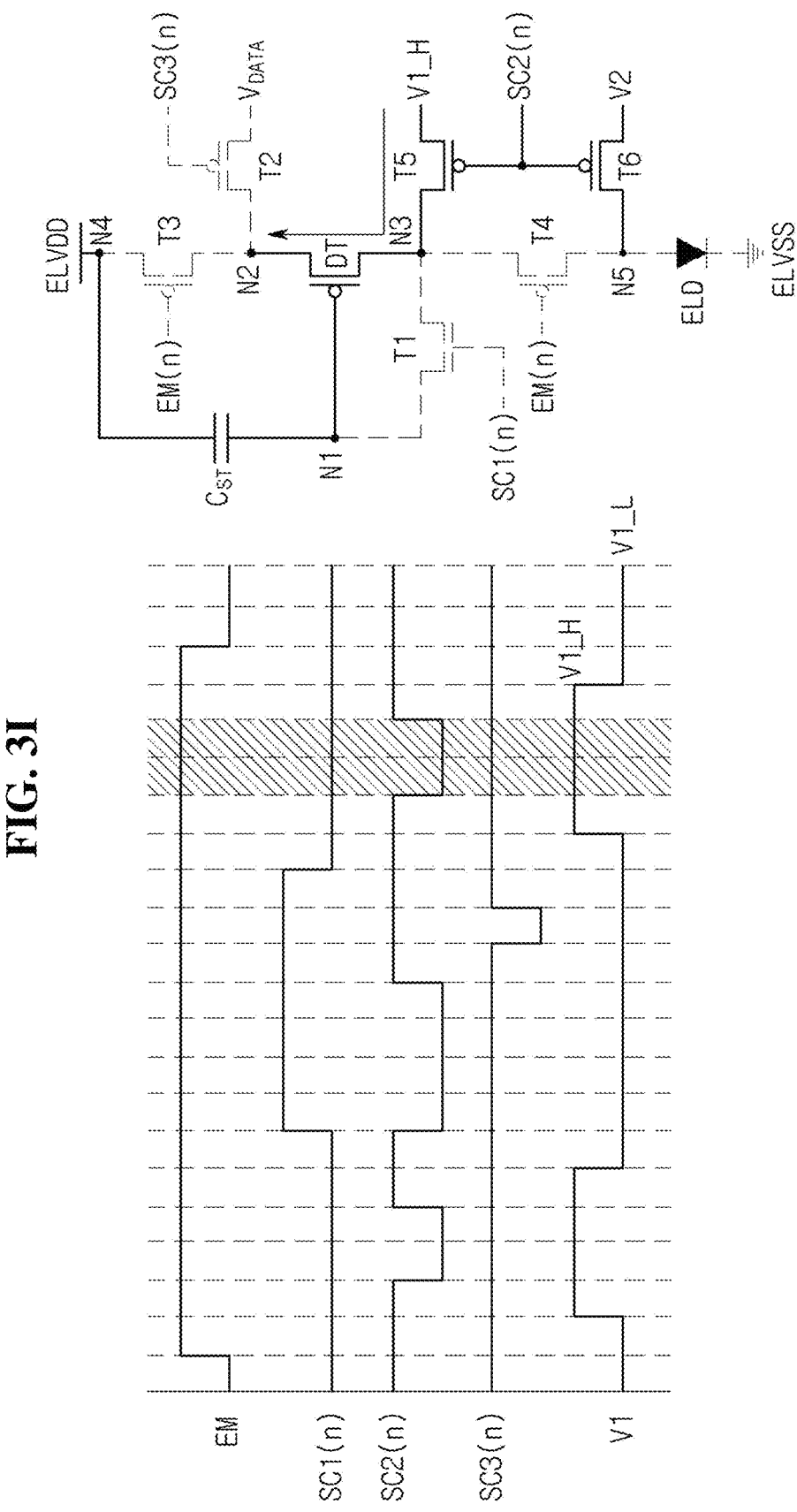
Figure 3J:
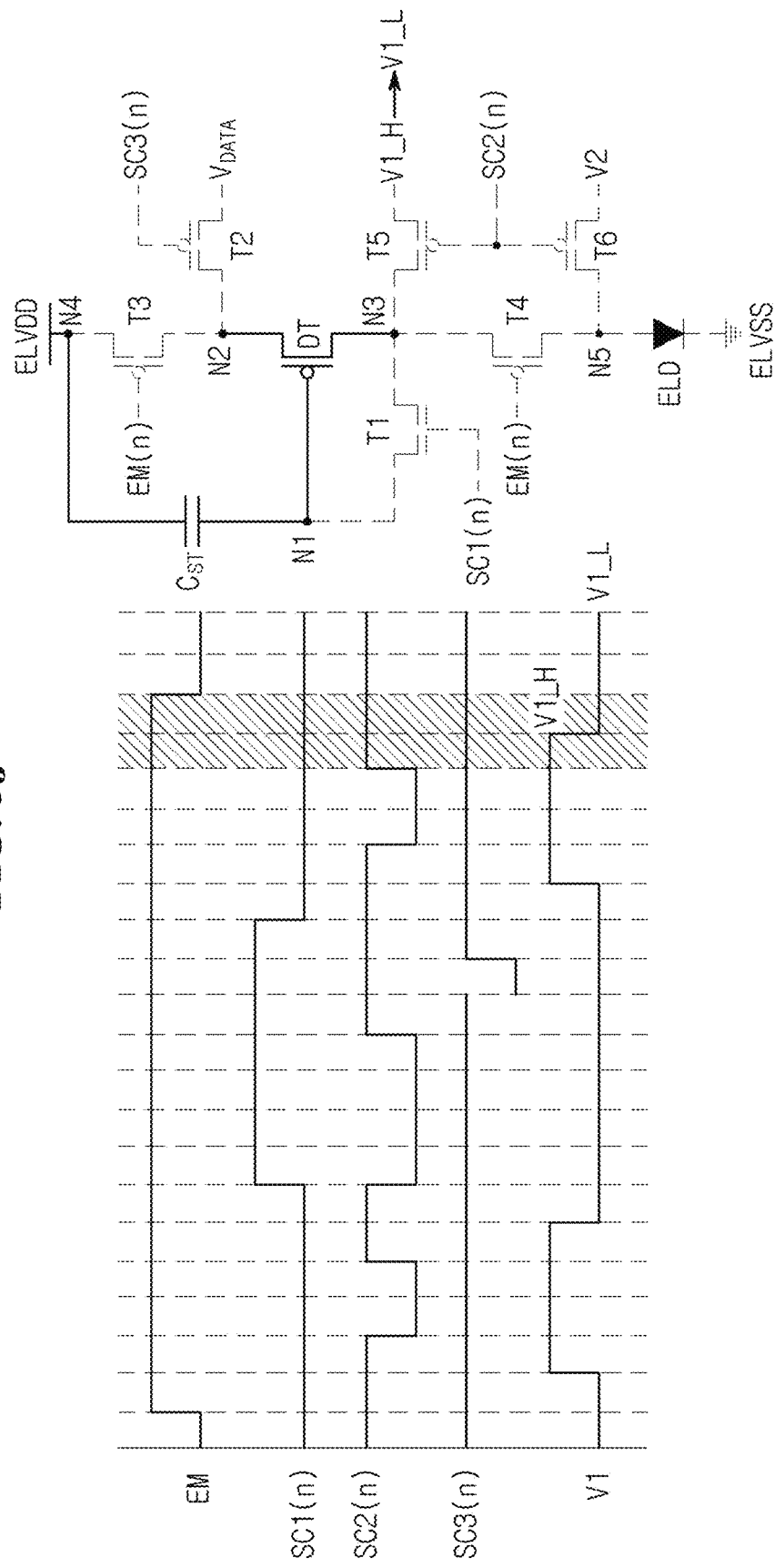

FIGS. 3H to 3J show a second bias section.

Since a driving waveform in the second bias section is the same as that of the first bias section, a detailed description thereof will be omitted.

In FIG. 3H, the first bias voltage V1 is changed from V1_L to V1_H.

In FIG. 3J, as the fifth transistor T5 is turned on, the voltage of the first electrode of the driving transistor DT connected to the second node N2 increases to the voltage V1_H. Here, the voltage Vgs between the gate and the source of the driving transistor DT is Vgs=Vdata(n)−|Vth|−V1_H. That is, the driving transistor DT maintains a stronger saturation. Also, as the sixth transistor T6 is turned on, the pixel electrode (or anode electrode) of the electroluminescent device ELD is initialized to the second bias voltage V2. The voltage of the gate electrode of the driving transistor DT connected to the first node N1 maintains Vdata(n)−|Vth|.

In FIG. 3J, the high second scan signal SC2 is input, and the first bias voltage V1 is changed from V1_H to V1_L. As the high second scan signal SC2 is input, the fifth and sixth transistors T5 and T6 are turned off. The voltage of the gate electrode of the driving transistor DT connected to the first node N1 maintains Vdata(n)−|Vth|.

Figure 3K:
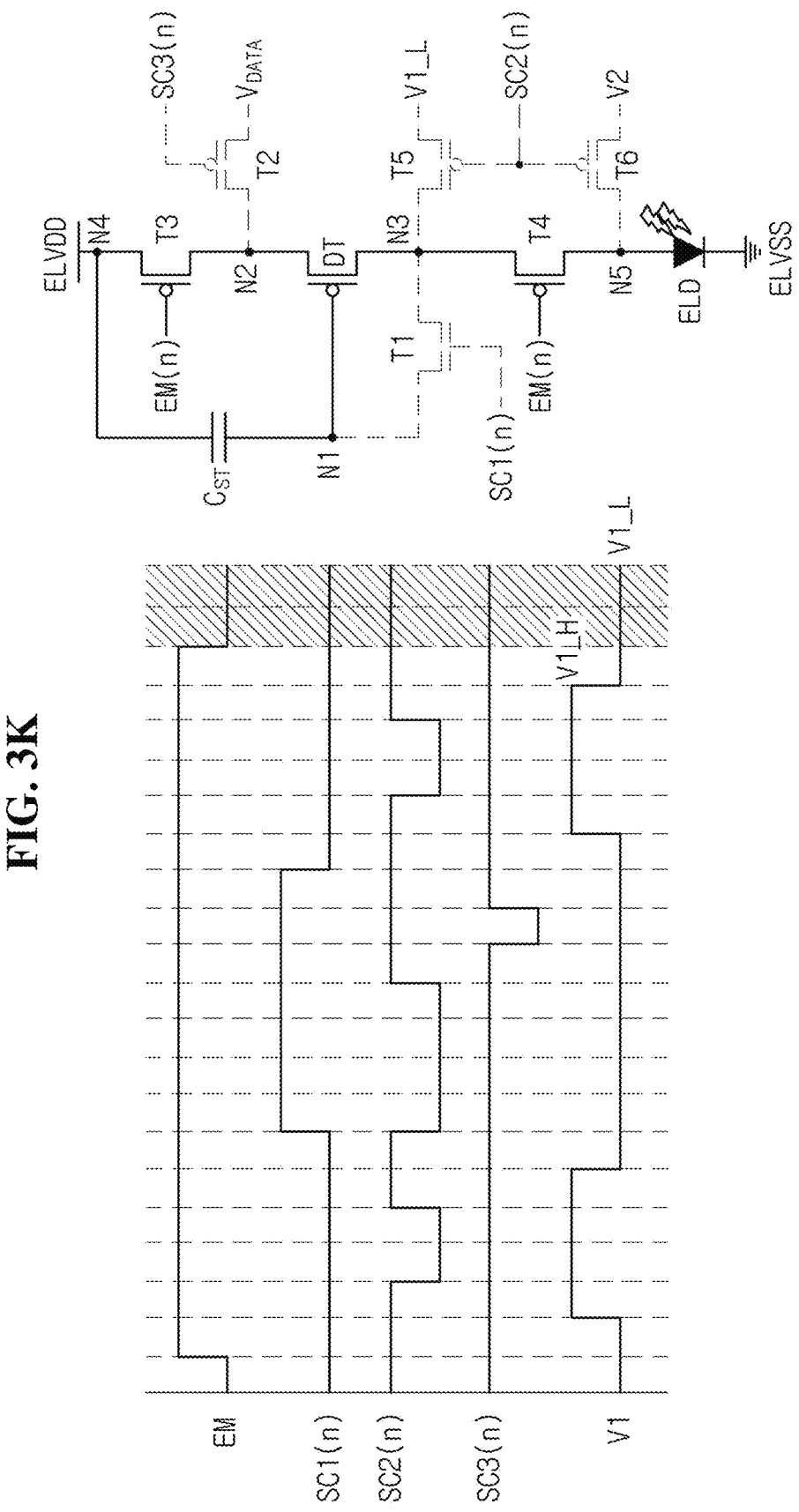

FIG. 3K shows the light emission section. In the light emission section, the sampled threshold voltage Vth is canceled and the electroluminescent device ELD is caused to emit light with a driving current corresponding to the sampled data voltage.

In FIG. 3K, state of the light emission signal EM is a low voltage, and the third and fourth transistors T3 and T4 are turned on.

As the third transistor T3 is turned on, the first power supply voltage ELVDD connected to the fourth node N4 is applied to the source electrode of the driving transistor DT connected to the second node N2 through the third transistor T3. The driving current Id supplied by the driving transistor DT to the electroluminescent device ELD via the fourth transistor T4 becomes irrelevant to the value of the threshold voltage Vth of the driving transistor DT, so that the threshold voltage Vth of the driving transistor DT is compensated.

Next, the driving of the electroluminescent device and the pixel circuit of the hold frame will be described with reference to FIGS. 4A to 4C. The hold frame may include at least one bias section and the light emission section.

As described above, the refresh frame and the hold frame are different in that while, in the refresh frame, a new data signal Vdata is charged and applied to the gate electrode of the driving transistor DT, in the hold frame, the data signal Vdata of the previous frame is maintained and used. Therefore, unlike the refresh frame, the hold frame does not require the initialization section and the sampling period.

FIGS. 4A and 4B show the first and second bias sections, and FIG. 4C shows the light emission section.

In the operation of the hold frame, even one bias period may be sufficient. However, in this embodiment, for convenience of the driving circuit, the second scan signal SC2 is driven in the same manner as the second scan signal SC2 of the refresh frame, and thus, there are two bias sections.

The drive signal in the refresh frame described with reference to FIGS. 3A to 3K and the drive signal in the hold frame in FIGS. 4A to 4C are different due to the first and third scan signals SC1 and SC3. The initialization section and the sampling section are not required in the hold frame. Therefore, unlike the refresh frame, the first scan signal SC1 is always in a low state, and the third scan signal SC3 is always in a high state. That is, the first and second transistors T1 and T2 are always turned off.

Figure 5:
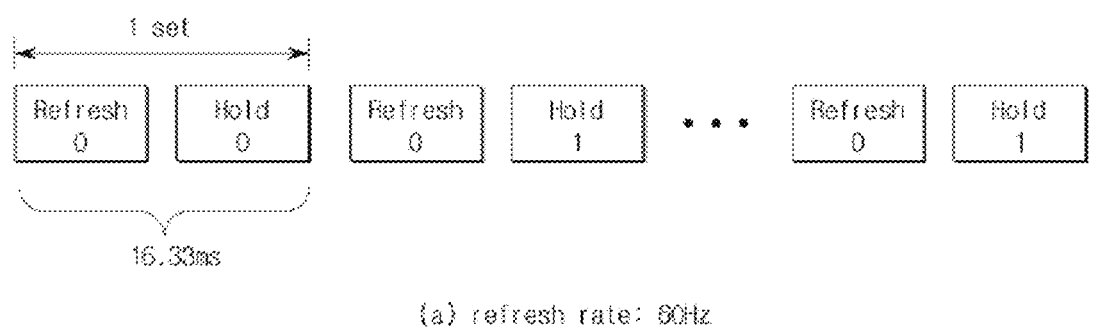
FIG. 5 is a view for describing a problem of the occurrence of a luminance difference when switching a refresh rate from 60 Hz to 1 Hz in the use of a VRR mode.
Figure 5:
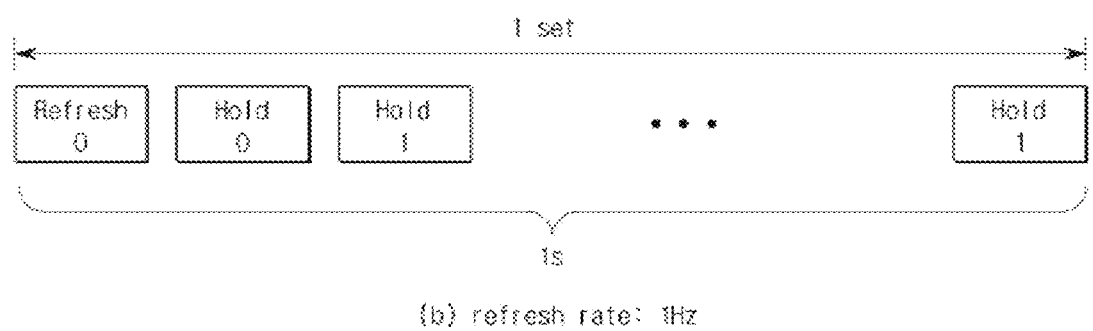

FIG. 5 is a view for describing a problem of the occurrence of a luminance difference when switching the refresh rate from 60 Hz to 1 Hz in the use of the VRR mode.

A case where the refresh rate is 60 Hz is shown in part (a) of FIG. 5, and a case where the refresh rate is 1 Hz is shown in part (b) of FIG. 5. The refresh frame period and hold frame period of each of the cases are 1/120 second (=8.33 ms), respectively. When the display device is driven at the refresh rate of 60 Hz, one set period is 1/60 second (=16.66 ms), and when the display device is driven at the refresh rate of 1 Hz, one set period is 1 second (=1 s).

As shown in part (a) of FIG. 5, when the pixel is driven at the refresh rate of 60 Hz, the refresh frame and the hold frame may be alternately driven. Accordingly, the bias voltage applied in the hold frame may be reset without being accumulated, by the initialization section of the refresh frame.

However, as shown in part (b) of FIG. 5, when the display device is driven at the refresh rate of 1 Hz, the refresh frame is continuously followed by the hold frame. Accordingly, the bias voltage applied in the hold frame is accumulated as a stress voltage of the driving transistor DT. As the number of times the bias voltage is applied to the driving transistor DT increases, the charge of the driving transistor DT increases and then the driving transistor DT is saturated. That is, when the pixel is driven at 60 Hz and at 1 Hz, the characteristics of the driving transistor DT are changed, resulting in a difference in luminance.

The difference in the characteristics of the driving transistor DT between the driving at 60 Hz and the driving at 1 Hz results from a difference in the amount of bias stress within one set. That is, while, when the display device is driven at the refresh rate of 60 Hz, there is one hold frame in one set, so that the bias stress is one time, when the display device is driven at the refresh rate of 1 Hz, there are 119 hold frames in one set, so that the bias stress is 119 times. Thus, a difference in the amount of bias stress occurs. As a result, the characteristics of the driving transistor DT are changed and a difference in luminance occurs. In other words, when the display device is driven by changing the refresh rate from a high refresh rate (e.g., 60 Hz) to a low refresh rate (e.g., 1 Hz), a difference in the amount of bias stress of the driving transistor DT occurs, and this causes the change of the characteristics of the driving transistor DT, so that the magnitude of the driving current Id is reduced. As a result, when the display device is driven by changing the refresh rate from a high refresh rate to a low refresh rate, the luminance of the electroluminescent device ELD decreases due to a decrease in the driving current Id. This is perceived as flicker by viewers at a point of time when the refresh rate changes.

In the display device provided by the present disclosure, the pixel circuit may be driven at the first refresh rate. And the pixel circuit may be driven by switching from the first refresh rate to the second refresh rate having a refresh rate lower than the first refresh rate.

Hereinafter, a method for preventing the difference in luminance by controlling the second voltage V1_H of the first bias voltage or the second bias voltage V2 before and after the refresh rate is changed.

First Embodiment

Figure 6:
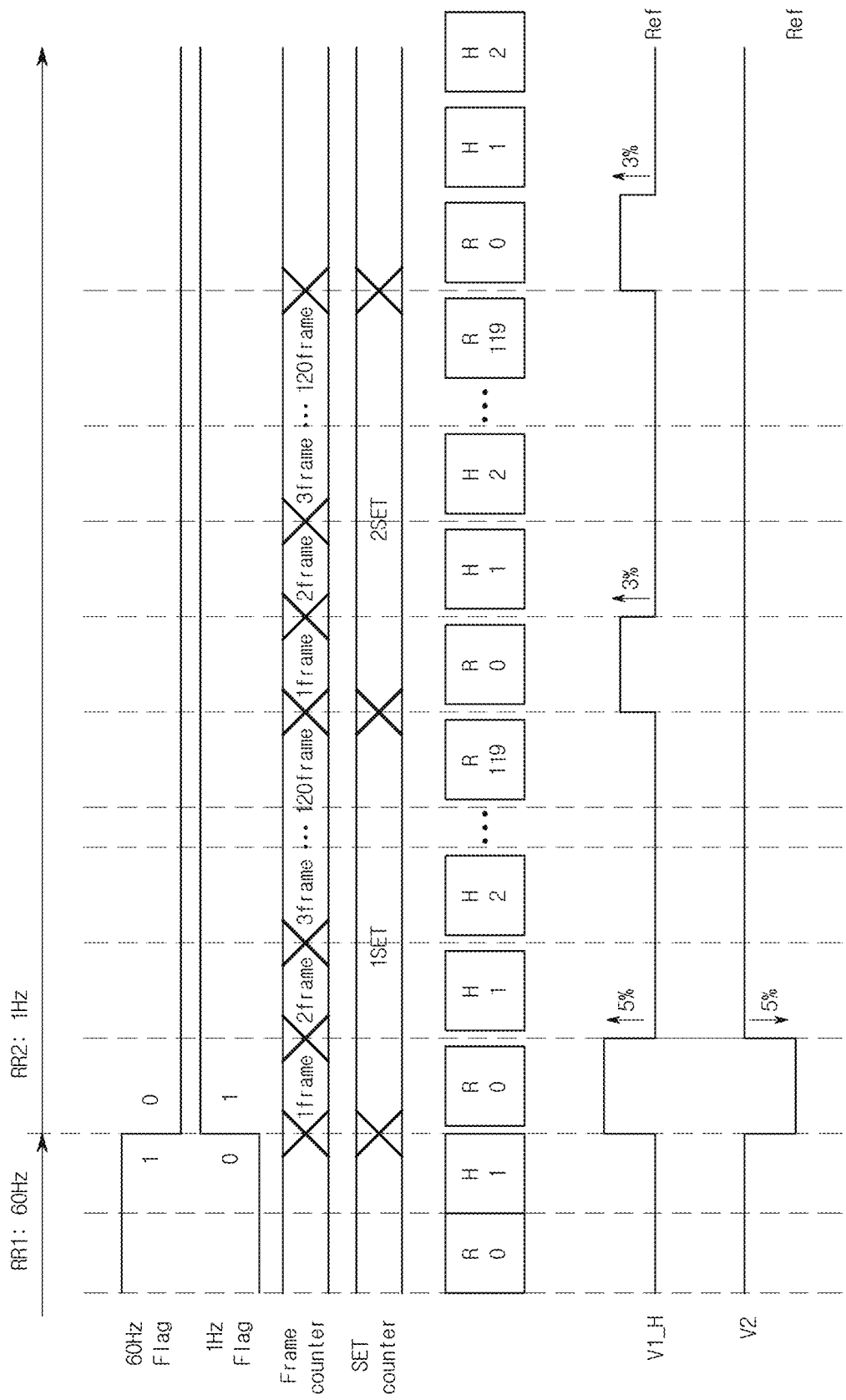
FIG. 6 is a view for describing a first method for luminance deviation compensation driving.

FIG. 6 is a view for describing a first method for luminance deviation compensation driving.

For example, the first refresh rate RR1 may be 60 Hz, and the second refresh rate RR2 may be 1 Hz. In the first refresh rate RR1 section, a flag value of the first refresh rate RR1 may have a value of 1, and a flag value of the second refresh rate RR2 may have a value of 0. Also, in the second refresh rate RR2 section, the flag value of the first refresh rate RR1 may have a value of 0, and the flag value of the second refresh rate RR2 may have a value of 1.

The second voltage V1_H of the first bias voltage V1 may be adjusted to a voltage higher than a reference voltage Ref by a first level in the first refresh frame period (frame R0 of 1 SET) after switching to the second refresh rate RR2. For example, the first level may be a value of 5% of the reference voltage Ref, and is not limited thereto.

The adjustment of the second voltage V1_H of the first bias voltage V1 in the first refresh frame period (frame R0 of 1 SET) after switching to the second refresh rate RR2 is to compensate for the luminance variation in this section. When the second voltage V1_H of the first bias voltage V1 is increased, the voltage of the channel of the driving transistor DT becomes higher than the voltage of the gate, thereby increasing the driving current Id. As a result, since the luminance of the electroluminescent device ELD is increased and compensated, when the pixel is driven by changing the refresh rate from a high refresh rate to a low refresh rate, it is possible to solve the problem of occurrence of flicker at the time when the refresh rate changes.

The second voltage V1_H of the first bias voltage V1 may be adjusted to a voltage higher than the reference voltage Ref by a second level in the refresh frame period (frame R0 of 2 SET) after the first refresh frame period after switching to the second refresh rate RR2. For example, the second level may be a value of 3% of the reference voltage Ref, and is not limited thereto. The characteristics of the driving transistor DT change the most immediately after switching to the second refresh rate RR2, and the reduced amount of the driving current Id is also the largest. Therefore, in the refresh frame period after the first refresh frame period, it is necessary to make the luminance compensation of the electroluminescent device ELD smaller. Therefore, it is preferable that the second level is lower than the first level.

The second bias voltage V2 may be adjusted to a voltage lower by the first level in the first refresh frame period after switching to the second refresh rate RR2. For example, the first level may be a value of 5% of the reference voltage Ref, and is not limited thereto. The second bias voltage V2 initializes the pixel electrode of the electroluminescent device ELD. Since the final luminance of the electroluminescent device ELD is reduced by reducing the initialization voltage, luminance deviation between the refresh frame and the hold frame can be prevented.

Second Embodiment

Figure 7:
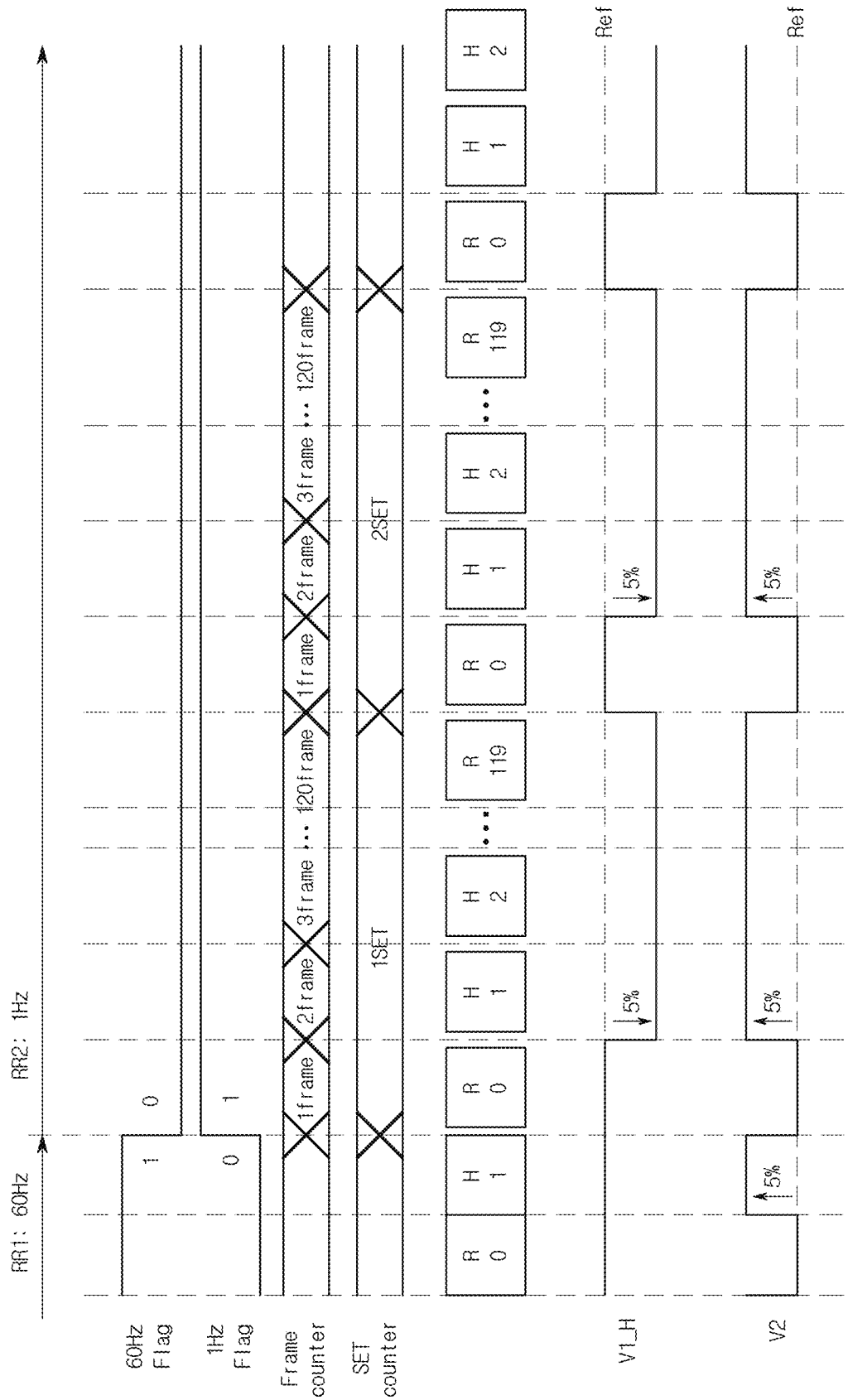
FIG. 7 is a view for describing a second method for luminance deviation compensation driving.

FIG. 7 is a view for describing a second method for luminance deviation compensation driving.

It has been described above that the difference in the characteristics of the driving transistor DT occurs between the driving at the first refresh rate and the driving at the second refresh rate. The difference in the characteristics of the driving transistor DT results from a difference in the amount of bias stress within one set. The second embodiment provides a method for removing a deviation of the amount of bias stress, which is a reason for the difference in characteristics of the driving transistor DT.

In order to reduce the amount of bias stress in driving at the second refresh rate, it is necessary to reduce the second voltage V1_H of the first bias voltage V1 in the hold frame period. Specifically, the second voltage V1_H of the first bias voltage V1 is adjusted to a voltage lower by the first level in the entire hold frame period after switching to the second refresh rate RR2, so that the deviation of the amount of bias stress can be removed. For example, the first level may be a value of 5% of the reference voltage Ref, and is not limited thereto.

Meanwhile, the luminance deviation may occur between the refresh frame and the hold frame because the second voltage V1_H of the first bias voltage V1 is reduced in the hold frame period. Therefore, in order to remove the luminance deviation between the refresh frame and the hold frame, it is necessary to correct the luminance by raising the second bias voltage V2 in the hold frame period. Specifically, the second bias voltage V2 is adjusted to a voltage higher by the first level in the entire hold frame period after switching to the second refresh rate RR2. Also, the second bias voltage V2 is adjusted to a voltage higher by the first level in the hold frame period H1 immediately before switching to the second refresh rate RR2. For example, the first level may be a value of 5% of the reference voltage Ref, and is not limited thereto.

Third Embodiment

Figure 8:
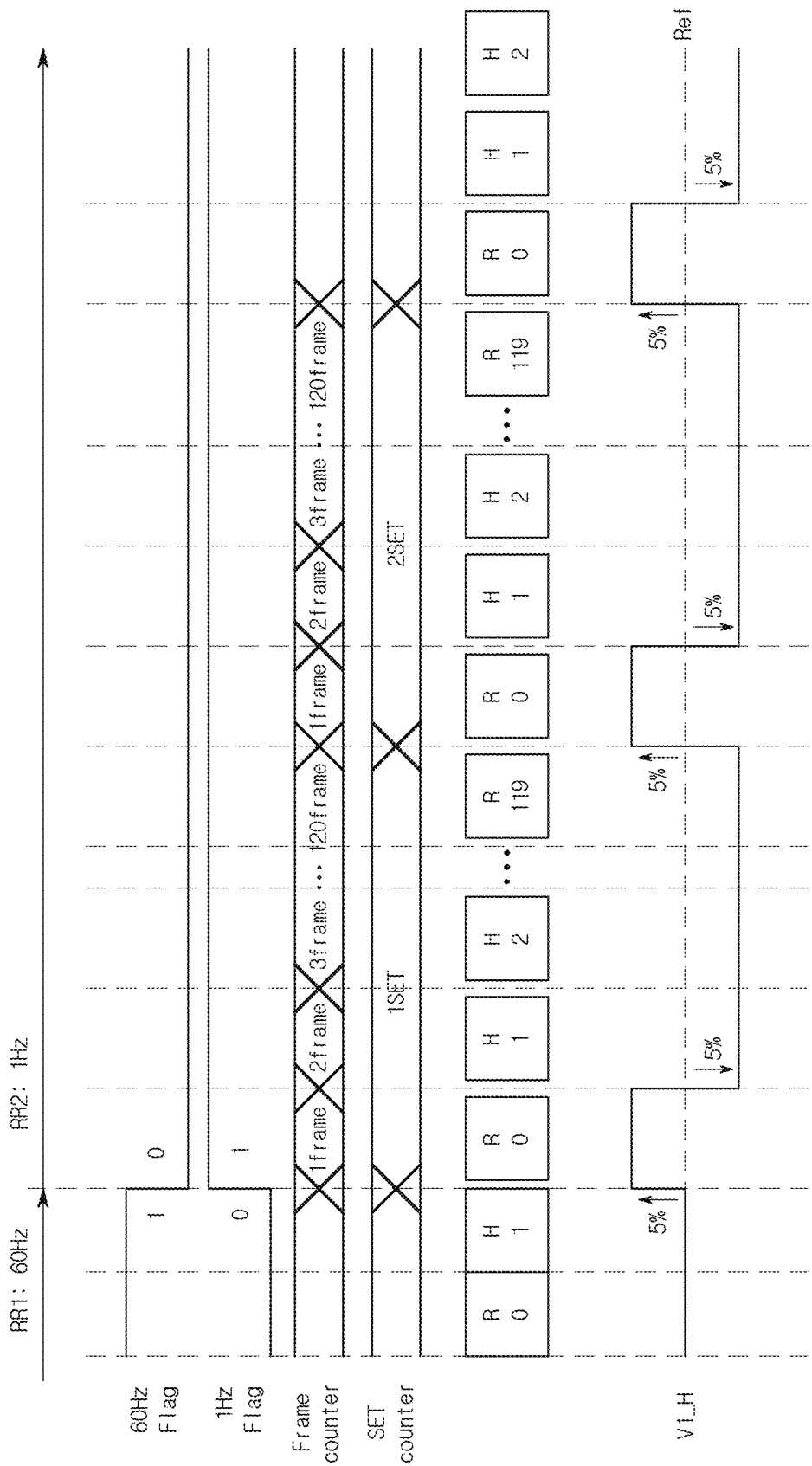
FIG. 8 is a view for describing a third method for luminance deviation compensation driving.

FIG. 8 is a view for describing a third method for luminance deviation compensation driving.

Unlike the first and second embodiments, the third embodiment is characterized in that the second bias voltage V2 is not adjusted and only the second voltage V1_H of the first bias voltage V1 is adjusted and driven.

First, in order to reduce the amount of bias stress in driving at the second refresh rate, the second voltage V1_H of the first bias voltage V1 is reduced in the hold frame period. Specifically, the second voltage V1_H of the first bias voltage V1 is adjusted to a voltage higher by the first level in the refresh frame period after switching to the second refresh rate RR2.

Also, in order to remove the luminance deviation between the refresh frame and the hold frame, the luminance is corrected by lowering the second voltage V1_H of the first bias voltage V1 in the hold frame period. Specifically, the voltage is adjusted to a voltage lower by the first level in the hold frame period. For example, the first level may be a value of 5% of the reference voltage Ref, and is not limited thereto.

The third embodiment has a characteristic in which the second voltage V1_H of the first bias voltage V1 has three voltage levels, that is, the reference voltage Ref, the first change voltage increased by the first level, and the second change voltage decreased by the first level.

Fourth Embodiment

Figure 9:
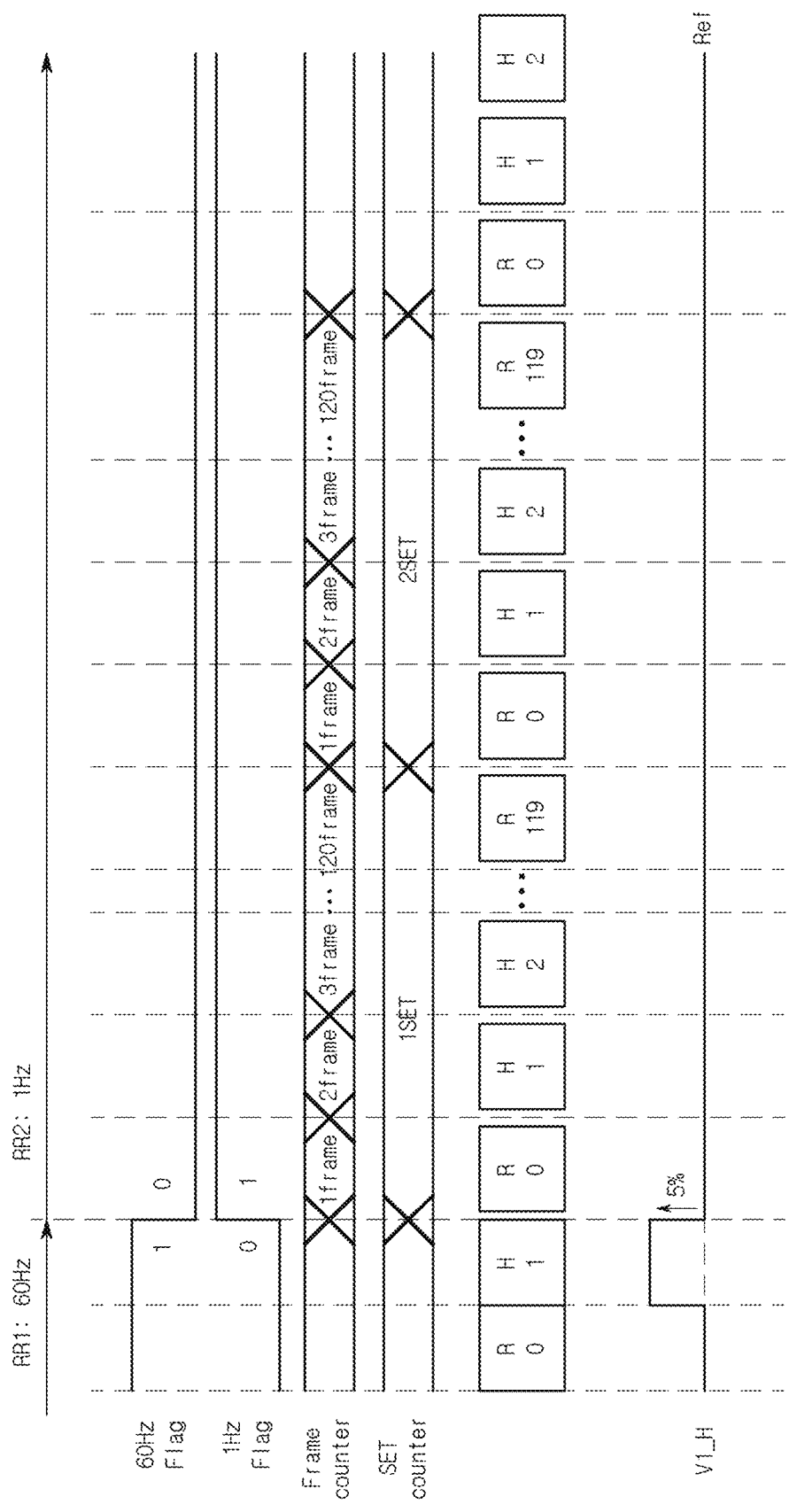
FIG. 9 is a view for describing a fourth method for luminance deviation compensation driving.

FIG. 9 is a view for describing a fourth method for luminance deviation compensation driving.

Unlike the third embodiment, the fourth embodiment is characterized in that the second voltage V1_H of the first bias voltage V1 has two voltage levels, that is, the reference voltage Ref and a changed voltage increased by the first level.

It has been described above that the difference in the characteristics of the driving transistor DT occurs between the driving at the first refresh rate and the driving at the second refresh rate. The difference in the characteristics of the driving transistor DT results from a difference in the amount of bias stress within one set. The fourth embodiment provides a method for removing a deviation of the amount of bias stress, which is a reason for the difference in characteristics of the driving transistor DT. The deviation of the amount of bias stress is removed by raising the second voltage V1_H of the first bias voltage V1 in the hold frame period immediately before switching to the second refresh rate RR2.

Specifically, the second voltage V1_H of the first bias voltage V1 is adjusted to a voltage higher by the first level in the hold frame period immediately before switching to the second refresh rate RR2. For example, the first level may be a value of 5% of the reference voltage Ref, and is not limited thereto.

According to the first to fourth methods of the luminance deviation compensation driving, the luminance deviation that occurs when the pixel is driven by changing the refresh rate from a high refresh rate (for example, 60 Hz) to a low refresh rate (for example, 1 Hz) can be eliminated.

As described above, the present disclosure relates to an electroluminescent display device using a variable refresh rate (VRR) mode. According to the first to fourth methods of the luminance deviation compensation driving, it is possible to eliminate the deviation of the amount of bias stress of the driving transistor DT that occurs when the pixel is driven by changing the refresh rate from a high refresh rate (for example, 60 Hz) to a low refresh rate (for example, 1 Hz). As a result, the occurrence of the difference in luminance when a refresh rate change is reduced, and viewers are not able to perceive that the refresh rate is changed.

Although the present disclosure has been described with reference to the embodiment shown in the drawings, this is just an example and it will be understood by those skilled in the art that various modifications and equivalent thereto may be made. Therefore, the true technical scope of the present disclosure should be determined by the spirit of the appended claims.

What is claimed is:

1. A display device comprising:
   a display panel including a display area including a plurality of pixels and non-display area surrounding the display area;
   a scan driver on the non-display area on both sides of the display area of the display panel; and
   a light emission signal driver on the non-display area adjacent to the scan driver of the display panel,
   wherein each the plurality of pixels includes:
      an electroluminescent device;
      a pixel circuit including:
         a driving transistor including a source electrode, a drain electrode, and a gate electrode, the driving transistor supplying a driving current to the electroluminescent device;
         at least one NMOS switching transistor configured to connect the drain electrode of the driving transistor and the gate electrode of the driving transistor in accordance with a scan signal supplied from the scan driver; and
         at least one PMOS switching transistor,
      wherein the pixel circuit is operable to vary a refresh rate of the electroluminescent device into a first refresh rate and a second refresh rate that is lower than the first refresh rate including at least one refresh frame period and at least one hold frame period, and
      wherein the at least one refresh frame period and the at least one hold frame period each includes a bias period.

2. The display device of claim 1, wherein the pixel circuit further includes:
   at least one light emission control transistor connected between a first power supply voltage and the electroluminescent device, the at least one light emission control transistor configured to form a current path through which the driving current flows.

3. The display device of claim 2, wherein the at least one light emission control transistor includes:
   a first light emission control transistor connected between the first power supply voltage and the source electrode of the driving transistor; and
   a second light emission control transistor connected between the drain electrode of the driving transistor and the electroluminescent device.

4. The display device of claim 3, wherein gate electrodes of the first light emission control transistor and the second light emission control transistor receive a light emission signal supplied from the light emission signal driver.

5. The display device of claim 1, wherein the pixel circuit further includes:
   a first bias transistor that is configured to apply a first bias voltage to the drain electrode of the driving transistor in accordance with a scan signal supplied from the scan driver.

6. The display device of claim 5, wherein the pixel circuit further includes:
   a second bias transistor that is configured to apply a second bias voltage to a pixel electrode of the electroluminescent device in accordance with the scan signal supplied from the scan driver.

7. The display device of claim 6, wherein a first bias voltage and a second bias voltage are supplied to the pixel circuit through a plurality of power supply lines in the bias period.

8. The display device of claim 6, wherein the first bias voltage and the second bias voltage have different or same voltage levels.

9. The display device of claim 6, wherein the first bias voltage has a first voltage and a second voltage that is higher than the first voltage, and
   wherein, before and after switching from the first refresh rate to the second refresh rate, the first voltage and second voltage of the first bias voltage are dynamically controlled.

10. The display device of claim 9, wherein the first voltage is controlled to a voltage higher by a first level in a first refresh frame period after switching to the second refresh rate.

11. The display device of claim 10, wherein the second bias voltage is controlled to a voltage that is lower by a first level in the first refresh frame period after switching to the second refresh rate.

12. The display device of claim 9, wherein the second voltage is controlled to a voltage that is lower by a first level in a hold frame period after switching to the second refresh rate.

13. The display device of claim 9, wherein, after switching to the second refresh rate, the first voltage is controlled to a voltage that is higher by a first level in a refresh frame period and the second voltage is controlled to a voltage that is lower by the first level in a hold frame period.

14. The display device of claim 9, wherein the first voltage is controlled to a voltage that is higher by a first level in a hold frame period immediately before switching to the second refresh rate.

15. The display device of claim 9, wherein the second bias voltage is controlled to a voltage that is higher by a first level in the at least one hold frame period after switching to the second refresh rate.

16. The display device of claim 1, wherein the pixel circuit includes at least one capacitor between a high potential voltage and the gate electrode of the driving transistor.

17. The display device of claim 1, wherein the pixel circuit further includes:
   a data supply transistor configured to connect the source electrode of the driving transistor and a data line in accordance with the scan signal supplied from the scan driver.

18. The display device of claim 17, wherein the scan signal includes:
   a first scan signal applied to a gate electrode of a compensation transistor;
   a second scan signal applied to gate electrodes of a first and a second bias transistors; and
   a third scan signal applied to a gate electrode of the data supply transistor.

19. The display device of claim 1, wherein the light emission signal driver varies a duty ratio of a light emitting signal according to the refresh rate.

* * * * *